(12) United States Patent
Bayliss et al.

(10) Patent No.: US 8,998,135 B1
(45) Date of Patent: Apr. 7, 2015

(54) TRANSLATING EQUIPMENT RACK SYSTEM

(75) Inventors: Andrew John Bayliss, Tulalip, WA (US); Stephen T. Brown, Lake Havasu, AZ (US); Perry Nicholas Rea, Everett, WA (US); Kevin Matthew Retz, Bothell, WA (US)

(73) Assignee: The Boeing Company, Chicago, IL (US)

( * ) Notice: Subject to any disclaimer, the term of this patent is extended or adjusted under 35 U.S.C. 154(b) by 995 days.

(21) Appl. No.: 13/102,265

(22) Filed: May 6, 2011

(51) Int. Cl.
*B64C 1/22* (2006.01)
*B64C 3/14* (2006.01)

(52) U.S. Cl.
CPC ........................... *B64C 3/141* (2013.01)

(58) Field of Classification Search
USPC ................................ 244/118.1, 118.5, 137.1
See application file for complete search history.

(56) References Cited

U.S. PATENT DOCUMENTS

| | | | | |
|---|---|---|---|---|
| 2,242,201 | A | * | 5/1941 | Woods ........................ 244/129.5 |
| 2,938,686 | A | * | 5/1960 | Lohstreter et al. ......... 244/118.1 |
| 3,028,130 | A | | 4/1962 | Burton |
| 4,153,225 | A | * | 5/1979 | Paulsen ...................... 244/118.1 |
| 4,763,859 | A | | 8/1988 | Biagini |
| 5,026,595 | A | | 6/1991 | Crawford, Jr. et al. |
| 5,241,722 | A | * | 9/1993 | Rohrlick et al. ................ 14/71.5 |
| 5,590,022 | A | | 12/1996 | Harvey |
| 5,639,535 | A | | 6/1997 | McCarville |
| 5,789,061 | A | | 8/1998 | Campbell et al. |
| 5,810,178 | A | | 9/1998 | Boette et al. |
| 5,827,383 | A | | 10/1998 | Campbell et al. |
| 6,070,742 | A | | 6/2000 | McAnally et al. |
| 6,494,404 | B1 | | 12/2002 | Meyer |
| 6,562,436 | B2 | | 5/2003 | George et al. |
| 6,689,448 | B2 | | 2/2004 | George et al. |
| 6,709,538 | B2 | | 3/2004 | George et al. |
| 8,087,611 | B2 | * | 1/2012 | Arnold et al. ............... 244/118.1 |
| 2002/0148928 | A1 | * | 10/2002 | Oki ............................ 244/118.1 |
| 2008/0001031 | A1 | * | 1/2008 | Doebertin et al. ......... 244/118.1 |
| 2008/0006593 | A1 | * | 1/2008 | Tenreiro et al. ............... 211/162 |
| 2008/0136299 | A1 | * | 6/2008 | Peurifoy ....................... 312/237 |
| 2009/0114770 | A1 | * | 5/2009 | Harrington et al. ........ 244/118.1 |
| 2009/0195135 | A1 | * | 8/2009 | Nemoz et al. ................. 312/408 |
| 2010/0162142 | A1 | | 6/2010 | Cooper et al. |
| 2010/0206988 | A1 | * | 8/2010 | Woodland .................. 244/129.5 |
| 2010/0235037 | A1 | | 9/2010 | Vian et al. |

(Continued)

FOREIGN PATENT DOCUMENTS

EP 01876875 A2 9/2008
WO WO9418068 A1 8/1994

OTHER PUBLICATIONS

Office Action, dated Jun. 7, 2013, regarding U.S. Appl. No. 12/985,033, 32 pages.

(Continued)

*Primary Examiner* — Tien Dinh
*Assistant Examiner* — Steven Hawk
(74) *Attorney, Agent, or Firm* — Yee & Associates, P.C.

(57) ABSTRACT

An apparatus and method comprising a rack and a translation mechanism. The rack may be configured to hold components. The rack may comprise movable rack segments that are movable independently of each other. The translation mechanism may be configured to move a portion of the movable rack segments relative to another portion of the movable rack segments inside a platform such that internal access to at least a portion of the components is provided inside the platform.

12 Claims, 22 Drawing Sheets

(56) References Cited

U.S. PATENT DOCUMENTS

2011/0127379 A1* 6/2011 Jager et al. .............. 244/118.1
2012/0325960 A1* 12/2012 Saint-Jalmes et al. ..... 244/118.1

OTHER PUBLICATIONS

EP search report dated May 14, 2012 regarding application 1193569. 8-1232, applicant reference NAM/P119904EP00, Applicant The Boeing Company, 5 Pages.

U.S. Appl. No. 12/985,033, filed Jan. 5, 2011, Bayliss et al.
Final Office Action, dated Nov. 21, 2013, regarding U.S. Appl. No. 12/985,033, 23 pages.
Bayliss et al., "Translating Equipment Rack System," U.S. Appl. No. 12/985,033, filed Jan. 5, 2011, 56 pages.
Office Action, dated Apr. 10, 2014, regarding U.S. Appl. No. 12/985,033, 20 pages.
Notice of Allowance, dated Oct. 30, 2014, regarding U.S. Appl. No. 12/985,033, 15 pages.

* cited by examiner

TRANSLATING EQUIPMENT RACK SYSTEM

CROSS REFERENCE TO RELATED APPLICATION

The present disclosure is related to the following patent application entitled: "Translating Equipment Rack System", Ser. No. 12/985,033; filed Jan. 5, 2011, assigned to the same assignee and incorporated herein by reference.

BACKGROUND INFORMATION

1. Field:

The present disclosure relates generally to equipment and, in particular, to packaging equipment. Still more particularly, the present disclosure relates to a method and apparatus for managing equipment in different locations in an aircraft.

2. Background:

An equipment bay may be an area within an aircraft in which equipment, such as, for example, without limitation, electrical equipment, power distribution equipment, computers, and other suitable components may be installed. The equipment bay may take the form of an avionics bay or electronics equipment bay.

The equipment bay may be located, without limitation, below the flight deck, behind the flight deck, and/or adjacent to a passenger or cargo area inside of an aircraft. Equipment stored in an equipment bay may be accessible through a passenger area, a cargo area, a hatch in the flight deck area, and/or an external hatch on an aircraft.

Equipment in the electronic equipment bay may be placed in equipment racks located in the electronic equipment bay. One or more aisles may be provided between the equipment racks in the electronic equipment bay to permit maintenance personnel and other technicians to move throughout the electronic equipment bay and between the equipment racks and access the electronic equipment.

For example, without limitation, equipment racks in the equipment bay may be placed with the front of the racks facing a central aisle. The central aisle may extend between the equipment racks. This central aisle may be used by maintenance personnel to access the equipment in the equipment racks. In-flight personnel may utilize one or more hatches in the flight deck or cabin areas to gain access to the equipment in the equipment bay during a flight of the aircraft.

In addition, one or more outboard aisles may connect the central aisle to an external hatch. This hatch may provide a point of access to the equipment bay for ground crew personnel. The ground crew personnel may utilize the external hatch to enter the electronic bay and proceed down the aisles to access the equipment in the equipment racks. The ground crew may access the equipment to perform installation, removal, and/or maintenance of the equipment.

Space in the aircraft may be a valuable resource. In designing aircraft, space may be allocated to passenger areas, crew areas, cargo areas, and equipment bays. Currently used equipment bays in aircraft may use more space in the aircraft than desired. In other words, spaces, such as equipment bays, may be reduced to allow for increases in spaces, such as passenger areas and/or cargo areas.

When equipment bays are designed with less space, access to the equipment bays through aisles may be reduced. This reduction may result in more time and effort needed for equipment maintenance. Further, equipment maintenance may also take more time and effort in a presence of varying sizes and depths of the individual electronic components stored in the equipment bays.

Therefore, it would be advantageous to have a method and apparatus that takes into account one or more of the issues discussed above, as well as other possible issues.

SUMMARY

In one advantageous embodiment, an apparatus may comprise a rack and a translation mechanism. The rack may be configured to hold components. The rack may comprise movable rack segments that are movable independently of each other. The translation mechanism may be configured to move a portion of the movable rack segments relative to another portion of the movable rack segments inside a platform such that internal access to at least a portion of the components is provided inside the platform.

In another advantageous embodiment, an equipment access system for an aircraft may comprise a rack, a translation mechanism, a connector system, and a structure. The rack may be located in an equipment bay inside the aircraft and may be configured to hold components. The rack may comprise movable rack segments that are movable independently of each other in the rack. The translation mechanism may be located in the equipment bay inside the aircraft. The translation mechanism may be configured to move a portion of the movable rack segments relative to another portion of the movable rack segments. The portion of the movable rack segments may be moved into another area inside the aircraft other than the equipment bay such that internal access to at least a portion of the components is provided inside the aircraft, and external access to the at least the portion of the components is provided outside of the aircraft. The translation mechanism may comprise at least one of wheels, tracks, rollers, sliders, arms, rails, hinges, pivot points, and joints associated with the rack and a number of actuators. The number of actuators may be connected to the movable rack segments and configured to move the movable rack segments. The connector system may be attached to the movable rack segments and configured to remain connected to the movable rack segments when the portion of the movable rack segments is moved into the another area inside the aircraft other than the equipment bay. The structure may be associated with the rack. The structure may be configured to separate the equipment bay in which the rack is located from the another area in the aircraft such that the structure provides a barrier configured to prevent cargo in the other another area from moving into the equipment bay. The structure may comprise parts in which each part is associated with a movable rack segment in the movable rack segments.

In yet another advantageous embodiment, a method may be provided for accessing components inside a platform. A portion of the components for which internal access is desired may be identified. A rack may be configured to hold the components and may comprise movable rack segments that are movable independently of each other in the rack. A portion of the movable rack segments may be moved inside the platform such that the internal access to at least the portion of the components identified is provided inside the platform.

In still yet another advantageous embodiment, a method may be provided for accessing components inside an aircraft. A portion of the components for which internal access is desired may be identified. A rack located in an equipment bay in the aircraft may be configured to hold the components. The rack may comprise movable rack segments that are movable independently of each other in the rack. A structure associated with the rack may be configured to separate the equipment bay in which the rack is located from another area in a platform and provide a barrier configured to prevent cargo in the another area from moving into the equipment bay. A portion of the movable rack segments may be moved from the equipment bay into the another area inside the aircraft other than the equipment bay such that the internal access to at least the portion of the components identified is provided in the another area inside the aircraft.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof, will best be understood by reference to the following detailed description of an advantageous embodiment of the present disclosure when read in conjunction with the accompanying drawings, wherein:

DETAILED DESCRIPTION

Figure 1:
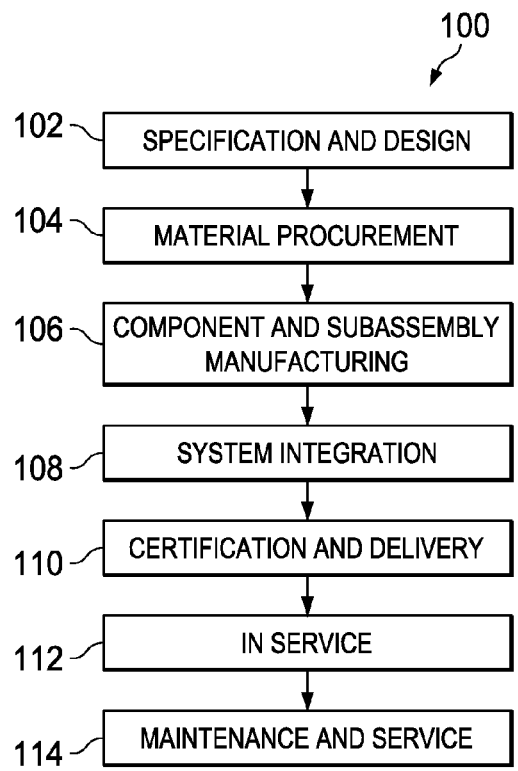
FIG. 1 is an illustration of an aircraft manufacturing and service method in accordance with an advantageous embodiment.
Figure 2:
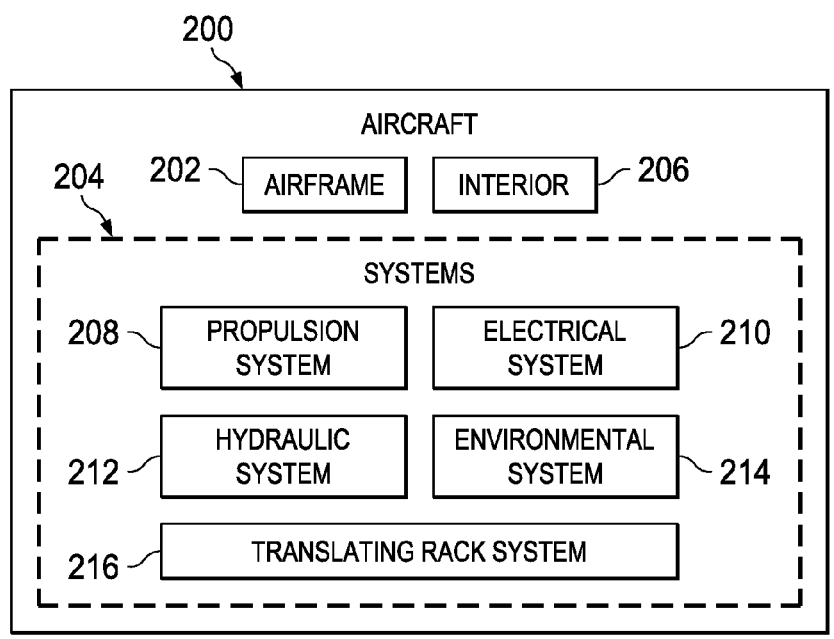
FIG. 2 is an illustration of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, an illustration of an aircraft manufacturing and service method is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 may take place. Thereafter, aircraft 200 in FIG. 2 may go through certification and delivery 110 in order to be placed in service 112. While in service 112 by a customer, aircraft 200 in FIG. 2 may be scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, a leasing company, a military entity, a service organization, and so on.

With reference now to FIG. 2, an illustration of an aircraft is depicted in which an advantageous embodiment may be implemented. In this example, aircraft 200 may be produced by aircraft manufacturing and service method 100 in FIG. 1 and may include airframe 202 with plurality of systems 204 and interior 206. Examples of systems 204 may include one or more of propulsion system 208, electrical system 210, hydraulic system 212, environmental system 214, and translating rack system 216. Any number of other systems may be included. Although an aerospace example is shown, different advantageous embodiments may be applied to other industries, such as the automotive industry.

Apparatuses and methods embodied herein may be employed during at least one of the stages of aircraft manufacturing and service method 100 in FIG. 1. As used herein, the phrase "at least one of", when used with a list of items, means that different combinations of one or more of the listed items may be used and only one of each item in the list may be needed. For example, "at least one of item A, item B, and item C" may include, for example, without limitation, item A, or item A and item B. This example also may include item A, item B, and item C or item B and item C.

In one illustrative example, components or subassemblies produced in component and subassembly manufacturing 106 in FIG. 1 may be fabricated or manufactured in a manner similar to components or subassemblies produced while aircraft 200 is in service 112 in FIG. 1. As yet another example, a number of apparatus embodiments, method embodiments, or a combination thereof may be utilized during production stages, such as component and subassembly manufacturing 106 and system integration 108 in FIG. 1. A number, when referring to items, means one or more items. For example, a number of apparatus embodiments may be one or more apparatus embodiments. A number of apparatus embodiments, method embodiments, or a combination thereof may be utilized while aircraft 200 is in service 112 and/or during maintenance and service 114 in FIG. 1. The use of a number of the different advantageous embodiments may substantially expedite the assembly and/or reduce the cost of aircraft 200.

The different advantageous embodiments recognize and take into account a number of different considerations. For example, the different advantageous embodiments recognize and take into account that with the space in an aircraft being a limited resource, it may be desirable to optimize the use of space for payloads that may generate revenues. For example, the different advantageous embodiments recognize and take into account that it may be desirable to increase the amount of space for passenger areas and cargo areas as compared to crew areas and equipment bays.

The different advantageous embodiments recognize and take into account that in using equipment racks with aisles in an equipment bay, the amount of space for the equipment bay may be greater than desired. The different advantageous embodiments recognize and take into account that the use of aisles in an equipment bay may increase the amount of space for the equipment bay in addition to the space used by the equipment racks. The different advantageous embodiments also recognize and take into account that in currently-used equipment bays, the design of the racks and the aisles may not be as ergonomic as desired for personnel to access the equipment in the equipment bays.

For example, the different advantageous embodiments also recognize and take into account that in some cases, an equipment bay may only be accessed through one access aisle. When access is only provided through one access aisle, all portions of an equipment rack may not be able to be accessed. Without access to all portions of the equipment rack, all storage space for components may not be able to be used. As a result, loading efficiency in the equipment bay may not be as high as desired with currently-used designs for equipment bays having one aisle for access to the equipment bay.

Further, the different advantageous embodiments recognize and take into account that providing external access to an equipment bay may require pressurized hatches and/or specialized safety systems, which may increase the weight of and/or expense for the aircraft.

Thus, the different advantageous embodiments provide an apparatus and method for providing internal access to components in an equipment bay. In one advantageous embodiment, an apparatus may comprise a rack and a translation mechanism. The rack may be configured to hold components. The rack may comprise movable rack segments that are movable independently of each other in the rack. The translation mechanism may be configured to move a portion of the movable rack segments inside a platform such that internal access to at least a portion of the components is provided inside the platform.

Figure 3:
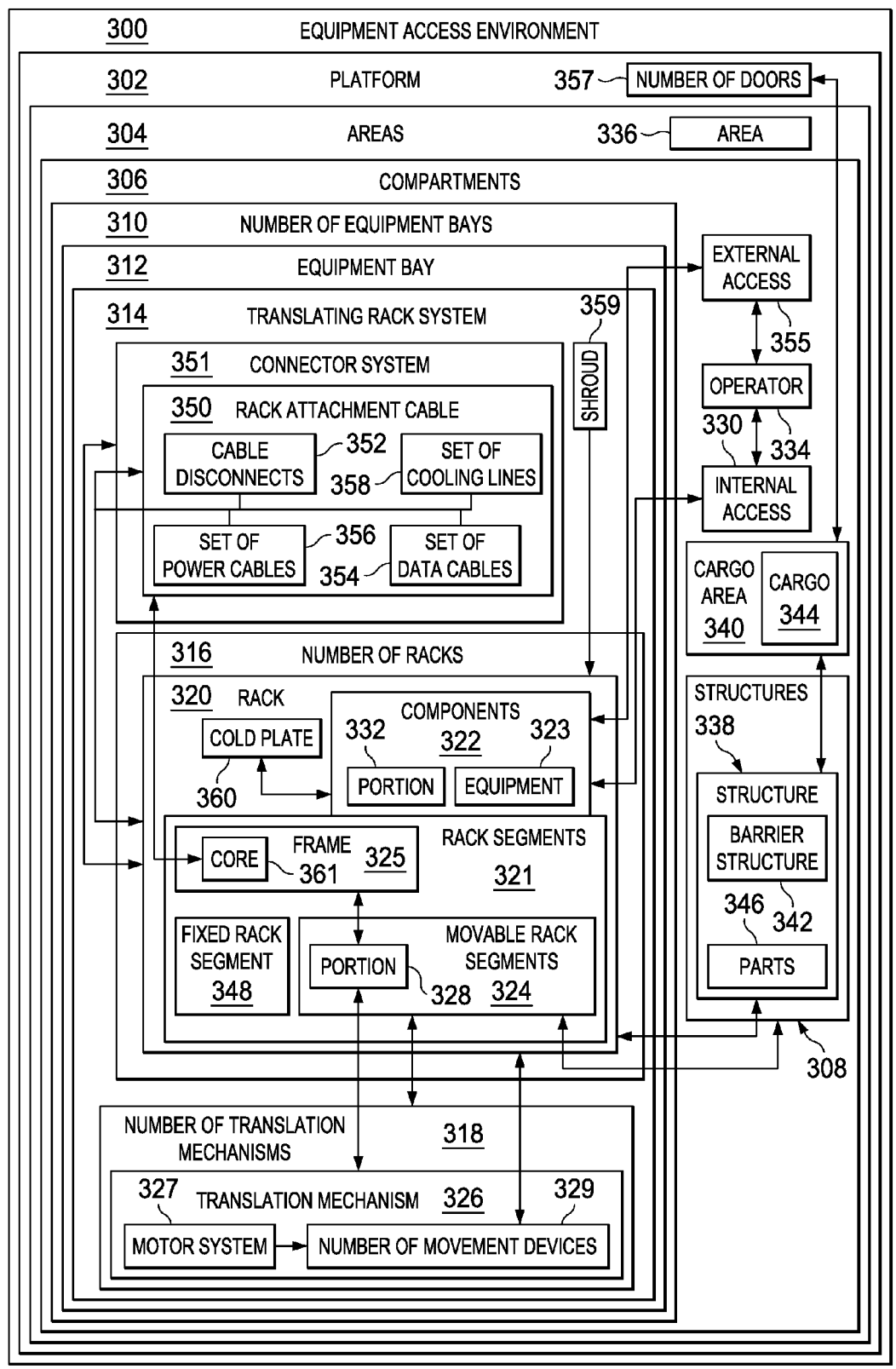
FIG. 3 is an illustration of a block diagram of an equipment access environment in accordance with an advantageous embodiment.

With reference now to FIG. 3, an illustration of a block diagram of an equipment access environment is depicted in accordance with an advantageous embodiment. In this depicted example, equipment access environment 300 may be implemented in platform 302. Platform 302 may take various forms. For example, platform 302 may be implemented using aircraft 200 in FIG. 2.

In this illustrative example, platform 302 may be subdivided into areas 304. At least a portion of areas 304 may take the form of compartments 306. Compartments 306 may be areas within areas 304 that may be partitioned off from other areas in areas 304 using structures 308. Structures 308 may be, for example, without limitation, walls, bulkheads, and/or other suitable structures.

For example, without limitation, compartments 306 may include number of equipment bays 310. In one illustrative example, equipment bay 312 within number of equipment bays 310 may be an example of one type of compartment in compartments 306. Equipment bay 312 may have translating rack system 314. Translating rack system 314 may be an example of a system used to implement translating rack system 216 in aircraft 200 in FIG. 2.

In these illustrative examples, translating rack system 314 may comprise number of racks 316 and number of translation mechanisms 318. Rack 320 may be a rack within number of racks 316 and may be configured to hold components 322. Components 322 may include, for example, without limitation, equipment 323 for platform 302. In some advantageous embodiments, equipment 323 may include, for example, without limitation, electronic equipment and/or electrical equipment that is modular.

Rack 320 also may comprise rack segments 321. Rack segments 321 are segments of rack 320 and, in this illustrative example, are not components within components 322. Each of rack segments 321 may have frame 325 configured to hold various components within components 322. In other words, frame 325 for each of rack segments 321 may provide a framework to support components 322 held within rack 320. In some illustrative examples, frame 325 may be a mounting frame to which components 322 may be mounted. In other illustrative examples, frame 325 may comprise a number of shelves, trays, pins, holders, hangers, hooks, and/or other supports configured to hold components 322.

In these illustrative examples, rack segments 321 may include movable rack segments 324 that may be movable independently of each other within rack 320. Each movable rack segment of movable rack segments 324 may be an actual part of rack 320. Number of translation mechanisms 318 may be configured to move a portion of movable rack segments 324 located inside platform 302 relative to another portion of movable rack segments 324. Number of translation mechanisms 318 may be implemented using any number of devices and/or systems that may move movable rack segments 324 inside of platform 302. Number of translation mechanisms 318 may be configured to move movable rack segments 324 individually with respect to each other.

In these depicted examples, translation mechanism 326 is an example of one of number of translation mechanisms 318. Translation mechanism 326 may be configured to move portion 328 of movable rack segments 324. Translation mechanism 326 may comprise motor system 327 and number of movement devices 329. Number of movement devices 329 may be associated with rack 320 and may be configured to facilitate movement of movable rack segments 324.

A first component may be considered to be associated with a second component by being secured to the second component, bonded to the second component, welded to the second component, fastened to the second component, and/or connected to the second component in some other suitable manner. The first component also may be connected to the second component using a third component. The first component also may be considered to be associated with the second component by being formed as part of and/or an extension of the second component.

In these illustrative examples, motor system 327 may be configured to generate motion for number of movement devices 329 in a manner that moves movable rack segments 324. Motor system 327 may take various forms. For example, without limitation, motor system 327 may comprise at least one of an actuator, an electrical motor, a hydraulic motor, and other suitable types of motors. In yet another illustrative example, motor system 327 may utilize a human operator and may comprise a hand crank, a manually-powered hand hoist system, and/or another suitable device.

Number of movement devices 329 may include devices configured to facilitate movement of movable rack segments 324 in rack 320. For example, without limitation, number of movement devices 329 may include at least one of a rail system, a number of rails, rollers, sliders, arms, wheels, tracks, a track system, hinges, pivot points, joints, and/or a re-circulating screwball jack.

As another illustrative example, translation mechanism 326 may comprise the hands of one or more human operators that may push and/or pull movable rack segments 324, a number of structures that may be manipulated by a human operator to push and/or pull movable rack segments 324, rails along which a human operator may push and/or pull movable rack segments 324, and/or some other suitable system for a human operator to move movable rack segments 324.

The movement of portion 328 of movable rack segments 324 by translation mechanism 326 inside platform 302 may be such that internal access 330 may be provided to portion 332 of components 322 inside platform 302. Portion 332 may be the portion of components 322 that is held within portion 328 of movable rack segments 324 of rack 320. In other words, operator 334 may access portion 332 of components 322 while being inside of platform 302. In this manner, internal access 330 may allow operator 334 to access portion 332 of components 322 without having to move portion 332 of components 322 or portion 328 of movable rack segments 324 outside of platform 302.

For example, without limitation, movement of portion 328 of movable rack segments 324 may move portion 328 of movable rack segments 324 from equipment bay 312 into area 336 within areas 304 in platform 302. Area 336 may be, for example, without limitation, a cargo area, a passenger area, a crew area, or some other suitable type of area within platform 302. Additionally, the movement of portion 328 of movable rack segments 324 may not move portion 328 outside of platform 302 in these illustrative examples.

In some advantageous embodiments, structure 338 within structures 308 may be associated with rack 320. For example, without limitation, structure 338 may be connected to movable rack segments 324 of rack 320. In these illustrative examples, structure 338 may comprise parts 346. Each part in parts 346 may be associated with a rack segment within movable rack segments 324 of rack 320.

Structure 338 may be used to define equipment bay 312 and/or cargo area 340 within compartments 306. For example, without limitation, structure 338 may provide a separation between components 322 held in rack 320 in equipment bay 312 and cargo 344 in cargo area 340. Further, structure 338 may be barrier structure 342 configured to prevent cargo 344 in cargo area 340 from moving into equipment bay 312. In other words, barrier structure 342 may be a barrier between cargo 344 in cargo area 340 and equipment bay 312.

In addition, in some advantageous embodiments, rack segments 321 may include fixed rack segment 348 in addition to movable rack segments 324. Fixed rack segment 348 may be configured to hold some of components 322. Fixed rack segment 348 may not be movable inside platform 302. With this type of implementation, movable rack segments 324 may move relative to fixed rack segment 348. As a result, movement of portion 328 of movable rack segments 324 is such that internal access 330 may be provided to at least portion 332 of components 322 held by at least one of fixed rack segment 348 and movable rack segments 324 inside of platform 302.

With translating rack system 314, internal access 330 may be provided to components 322 without needing additional doors in platform 302. External access 355 may be needed for some of components 322. External access 355 may be provided through number of doors 357 that may be present for other purposes other than providing external access 355.

For example, without limitation, number of doors 357 may open into cargo area 340 and may provide for movement of cargo 344 in cargo area 340 onto and off of platform 302 in addition to providing external access 355. In particular, when portion 328 of movable rack segments 324 is moved into cargo area 340, number of doors 357 may provide external access 355 to portion 332 of components 322 in cargo area 340.

In the different illustrative examples, translating rack system 314 also may include connector system 351. Connector system 351 may provide a connection to rack 320. In particular, connector system 351 may provide power, coolant, communications, and/or other suitable items to rack 320. Components 322 may be connected to connector system 351 through rack 320. In some illustrative examples, components 322 may be connected directly to connector system 351.

For example, without limitation, connector system 351 may comprise rack attachment cable 350. Rack attachment cable 350 may be a transport mechanism for transporting data, electricity, or cooling lines through rack 320. Rack attachment cable 350 may be a flexible, semi-flexible, or rigid cable.

Rack attachment cable 350 may connect rack 320 with one or more sources of power, data, or cooling mediums located within platform 302. For example, without limitation, rack attachment cable 350 may be a cable through which additional cables may run.

Rack attachment cable 350 may include cable disconnects 352. Cable disconnects 352 may allow rack attachment cable 350 to be quickly disconnected from platform 302 to allow fast removal of rack 320 from platform 302.

Rack attachment cable 350 may include set of data cables 354, set of power cables 356, and/or set of cooling lines 358. "A set", as used herein, means one or more items. For example, a set of cables may mean one or more cables. Set of data cables 354 may be one or more cables for transmitting input and/or output to and from components 322 held in rack 320.

Set of power cables 356 may be cables delivering electric power to rack 320 and/or components 322 held in rack 320. Set of cooling lines 358 may be lines carrying coolant, water, and/or air for controlling or conditioning a temperature of electronic devices in components 322. The controlling or conditioning of the temperature may be, for example, without limitation, lowering the temperature of the electronic devices, maintaining the temperature of the electronic devices within a range of temperatures, and/or some other type of controlling or conditioning of the temperature.

In some advantageous embodiments, frame 325 may have core 361. Core 361 may be, for example, without limitation, a metallic core that is hollow to allow rack attachment cable 350 to be installed within core 361. Running rack attachment cable 350 through core 361 may provide additional protection to rack attachment cable 350 from undesired effects due to factors external to rack attachment cable 350.

In other advantageous embodiments, rack 320 holding components 322 may be covered by shroud 359. Shroud 359 may be attached to rack 320, one or more of structures 308, and/or platform 302 to enclose and/or environmentally protect components 322 when components 322 are being accessed externally.

Shroud 359 may be, for example, without limitation, flexible, electrically conductive, and/or electrically grounded to platform 302 to provide components 322 held in rack 320 electromagnetic energy protection, such as, for example, without limitation, shielding protection.

In this manner, translating rack system 314 with structure 338 forms an equipment access system that provides internal access 330 and/or external access 355 to equipment bay 312.

The illustration of equipment access environment 300 in FIG. 3 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, platform 302 has been described as taking the form of aircraft 200 in FIG. 2. In some advantageous embodiments, platform 302 may take other forms. For example, without limitation, platform 302 may be selected from one of a mobile platform, a stationary platform, a land-based structure, an aquatic-based structure, a space-based structure, a surface ship, a tank, a personnel carrier, a train, a spacecraft, a space station, a submarine, or some other suitable type of platform.

As another illustrative example, a number of additional equipment bays may be present in addition to equipment bay 312 in platform 302. Some or all of these additional equipment bays also may include additional translating rack systems in addition to translating rack system 314 in equipment bay 312. Further, translating rack system 314 may be in other areas other than equipment bay 312, depending on the particular implementation. For example, translating rack system 314 may be located in cargo area 340 and may hold at least one of tools, cargo, parts, and/or other suitable items.

In still other illustrative examples, translating rack system 314 may include features in addition to the features described above. For example, without limitation, translating rack system 314 may include cold plate 360. Cold plate 360 may be used within rack 320 for cooling. As one specific example, cold plate 360 may be configured to remove heat by convection. Cold plate 360 may use liquid as the means to transport the heat away from components 322.

Figure 4:
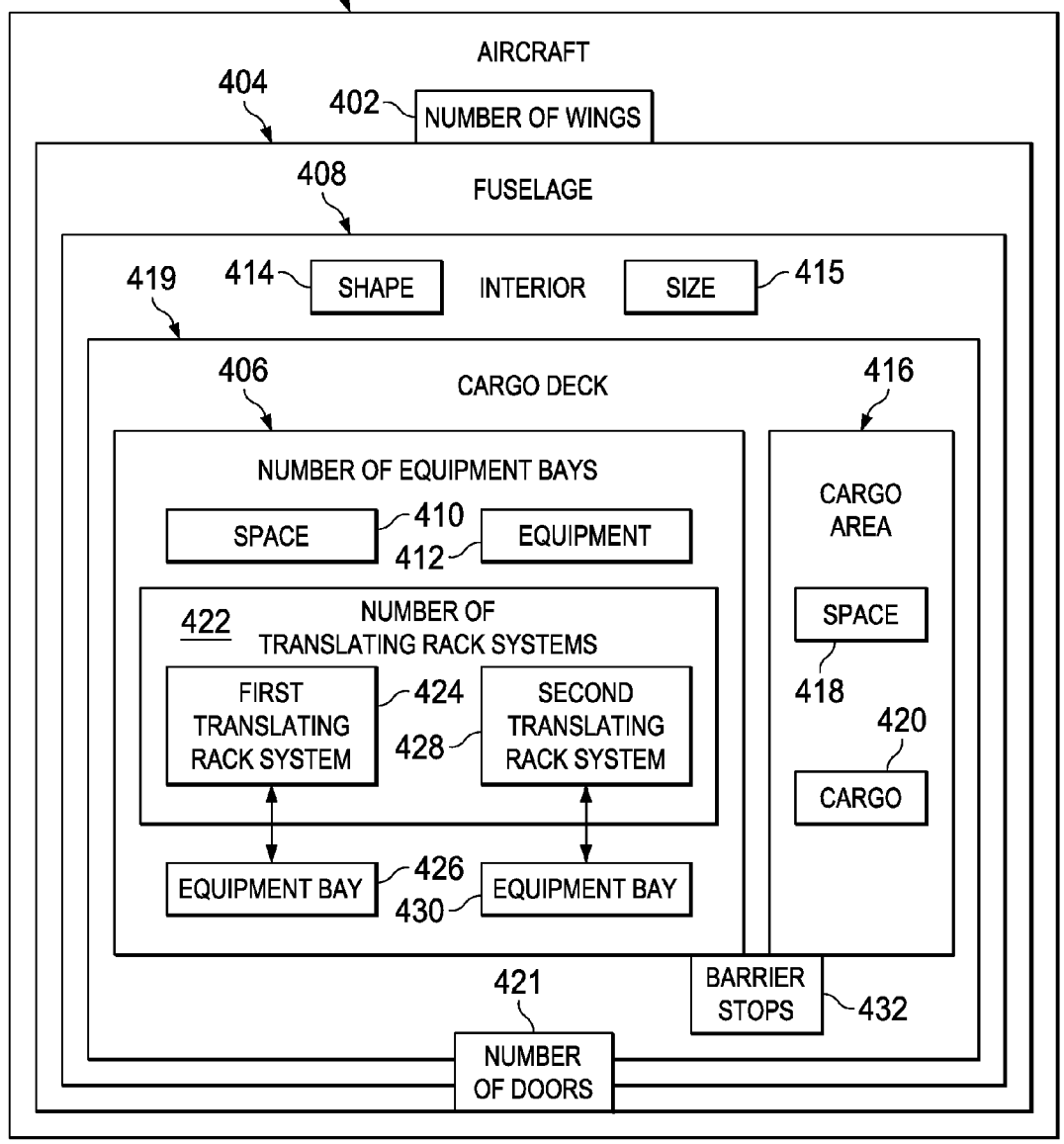
FIG. 4 is an illustration of a block diagram of an aircraft in which an equipment access environment may be present in accordance with an advantageous embodiment.

With reference now to FIG. 4, an illustration of a block diagram of an aircraft in which an equipment access environment may be present is depicted in accordance with an advantageous embodiment. In this illustrative example, aircraft 400 may be an example of one implementation for aircraft 200 in FIG. 2 and platform 302 in FIG. 3, in which equipment access environment 300 may be provided.

In this illustrative example, aircraft 400 may have number of wings 402 attached to fuselage 404. Number of equipment bays 406 may be located inside interior 408 of fuselage 404 of aircraft 400. In some illustrative examples, space 410 available for storing equipment 412 in each of number of equipment bays 406 may be determined by shape 414 and/or size 415 of interior 408 of fuselage 404.

Additionally, cargo area 416 may also be located inside interior 408 of fuselage 404. Space 418 available for storing cargo 420 in cargo area 416 may also be determined by shape 414 and/or size 415 of interior 408 of fuselage 404.

In this illustrative example, cargo area 416 and number of equipment bays 406 may be located in cargo deck 419 inside interior 408 of fuselage 404. Further, in this illustrative example, aircraft 400 may have number of doors 421. Number of doors 421 may allow an operator (not shown) outside of fuselage 404 to access equipment 412 and/or cargo 420 stored in cargo deck 419.

As depicted, number of translating rack systems 422 may be located in number of equipment bays 406. For example, number of translating rack systems 422 may include first translating rack system 424 located in equipment bay 426 in number of equipment bays 406 and second translating rack system 428 located in equipment bay 430 in number of equipment bays 406.

In this illustrative example, each of number of translating rack systems 422 may be implemented using translating rack system 314 from FIG. 3. Further, each of number of translating rack systems 422 may be configured to hold equipment 412 in a manner that allows access to different portions of equipment 412 in number of equipment bays 406.

Further, barrier stops 432 may also be present in number of equipment bays 406. Barrier stops 432 may limit movement of equipment 412 held by number of translating rack systems 422 into cargo area 416. Further, barrier stops 432 may also prevent cargo 420 from entering number of equipment bays 406.

Figure 5:
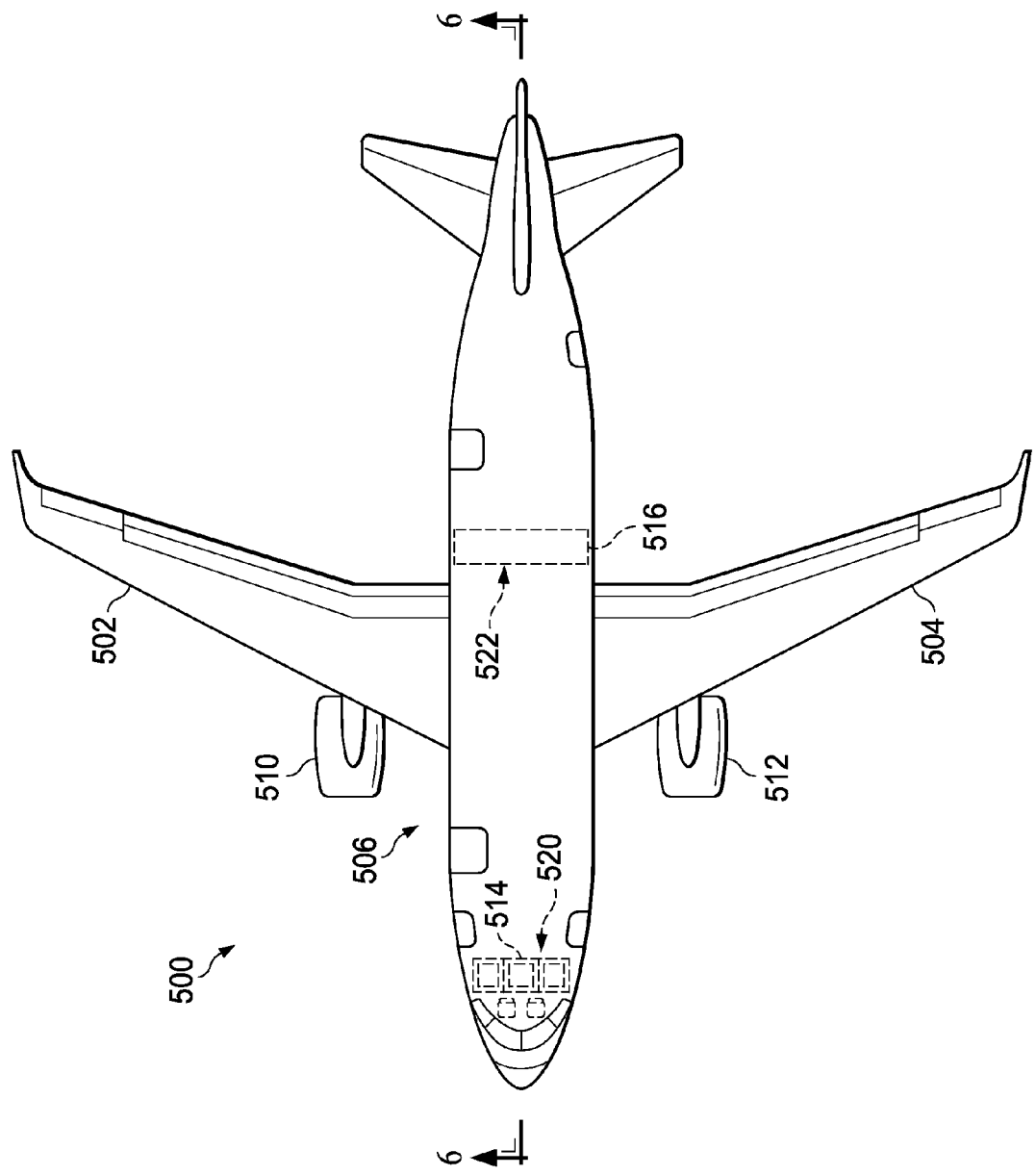
FIG. 5 is an illustration of an aircraft in which an equipment access environment may be present in accordance with an advantageous embodiment.

With reference now to FIG. 5, an illustration of an aircraft in which an equipment access environment may be present is depicted in accordance with an advantageous embodiment. In this illustrative example, aircraft 500 may be an example of one implementation for aircraft 400 in FIG. 4 and is not meant to imply physical or architecture limitations to the manner in which an advantageous embodiment may be implemented.

In this illustrative example, aircraft 500 may have wing 502 and wing 504 attached to fuselage 506. Aircraft 500 also may have engine 510 mounted on wing 502 and engine 512 mounted on wing 504. Equipment bay 514 and equipment bay 516 may be located inside aircraft 500 and, in particular, inside fuselage 506 in these illustrative examples. In these different illustrative examples, translating rack system 520 may be located inside equipment bay 514, and translating rack system 522 may be located inside equipment bay 516.

In the different illustrative examples, translating rack system 520 and translating rack system 522 may be examples of number of translating rack systems 422 in aircraft 400 in FIG. 4.

Figure 6:
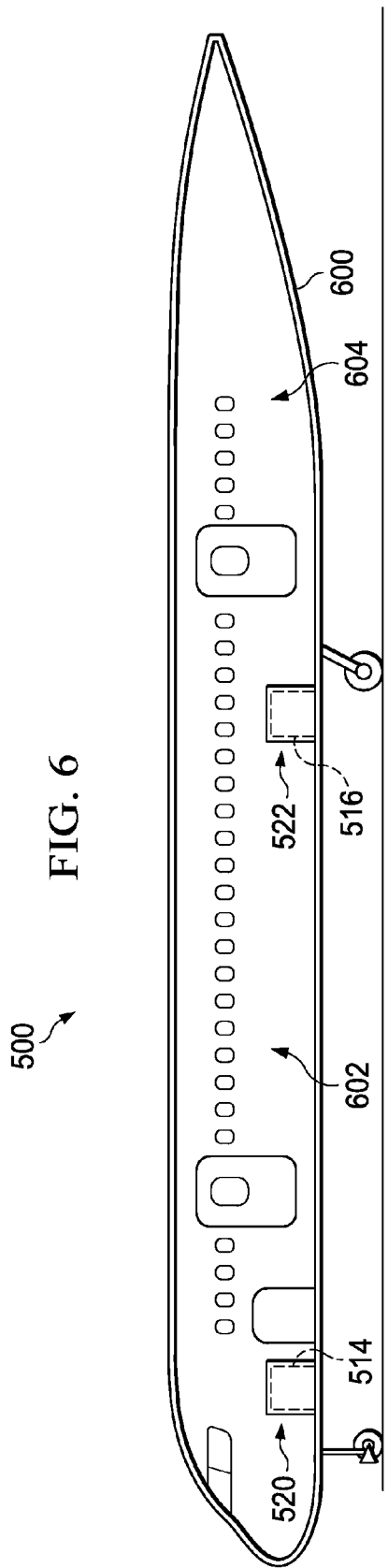
FIG. 6 is an illustration of a side cross-sectional view of an aircraft in accordance with an advantageous embodiment.

With reference now to FIG. 6, an illustration of a side cross-sectional view of aircraft 500 is depicted in accordance with an advantageous embodiment. In this illustrative example, a side cross-sectional view of aircraft 500 may be shown taken along lines 6-6 in FIG. 5. As depicted, equipment bay 514 with translating rack system 520 and equipment bay 516 with translating rack system 522 may be seen as being located on cargo deck 600 of aircraft 500. Cargo area 602 and cargo area 604 also may be located on cargo deck 600 of aircraft 500.

Figure 7:
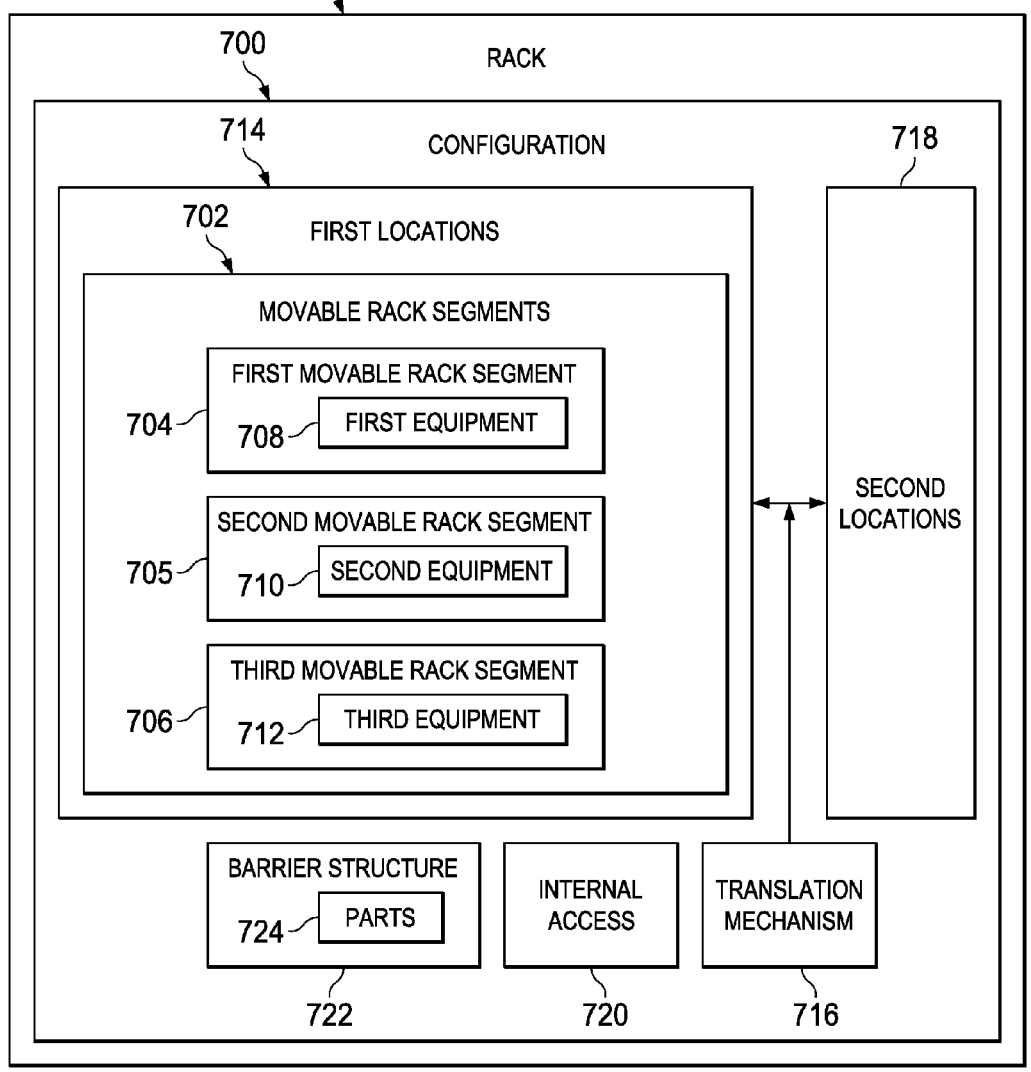
FIG. 7 is an illustration of one configuration for a rack in a translating rack system in accordance with an advantageous embodiment.

With reference now to FIG. 7, an illustration of one configuration for a rack in a translating rack system is depicted in accordance with an advantageous embodiment. In this illustrative example, configuration 700 for rack 701 is an example of one implementation for a configuration for a rack for one of number of translating rack systems 422 in FIG. 4. In particular, configuration 700 for rack 701 may be an example of one implementation for a configuration for a rack for first translating rack system 424 in equipment bay 426 in FIG. 4.

As depicted, with configuration 700, rack 701 may have movable rack segments 702. As one illustrative example, moveable rack segments 702 may include first movable rack segment 704, second movable rack segment 705, and third movable rack segment 706. Of course, in other illustrative examples, movable rack segments 702 may include any number of movable rack segments.

First movable rack segment 704 may be configured to hold first equipment 708. Second movable rack segment 705 may be configured to hold second equipment 710. Third movable rack segment 706 may be configured to hold third equipment 712. First equipment 708, second equipment 710, and third equipment 712 may be examples of equipment 412 in FIG. 4.

In this depicted example, movable rack segments 702 are present in first locations 714 in equipment bay 426 from FIG. 4. Movable rack segments 702 may move away from first locations 714 independently of each other by translation mechanism 716. Translation mechanism 716 may be implemented using, for example, without limitation, translation mechanism 326 in FIG. 3.

For example, without limitation, any of movable rack segments 702 may be moved from a location in first locations 714 to a location in second locations 718 in equipment bay 426 in FIG. 4. Movement of a particular movable rack segment in movable rack segments 702 may provide internal access 720 to at least a portion of the equipment held by the particular movable segment and/or various portions of equipment held by other movable rack segments in movable rack segments 702.

Additionally, barrier structure 722 may be associated with rack 701 in this depicted example. Barrier structure 722 may have parts 724. Each of parts 724 may be associated with a movable rack segment in movable rack segments 702. Barrier structure 722 may provide a barrier between cargo area 416 in FIG. 4 and equipment bay 426 in FIG. 4. In particular, barrier structure 722 may separate first equipment 708, second equipment 710, and third equipment 712 held within rack 701 from cargo area 416 in FIG. 4.

Figure 8:
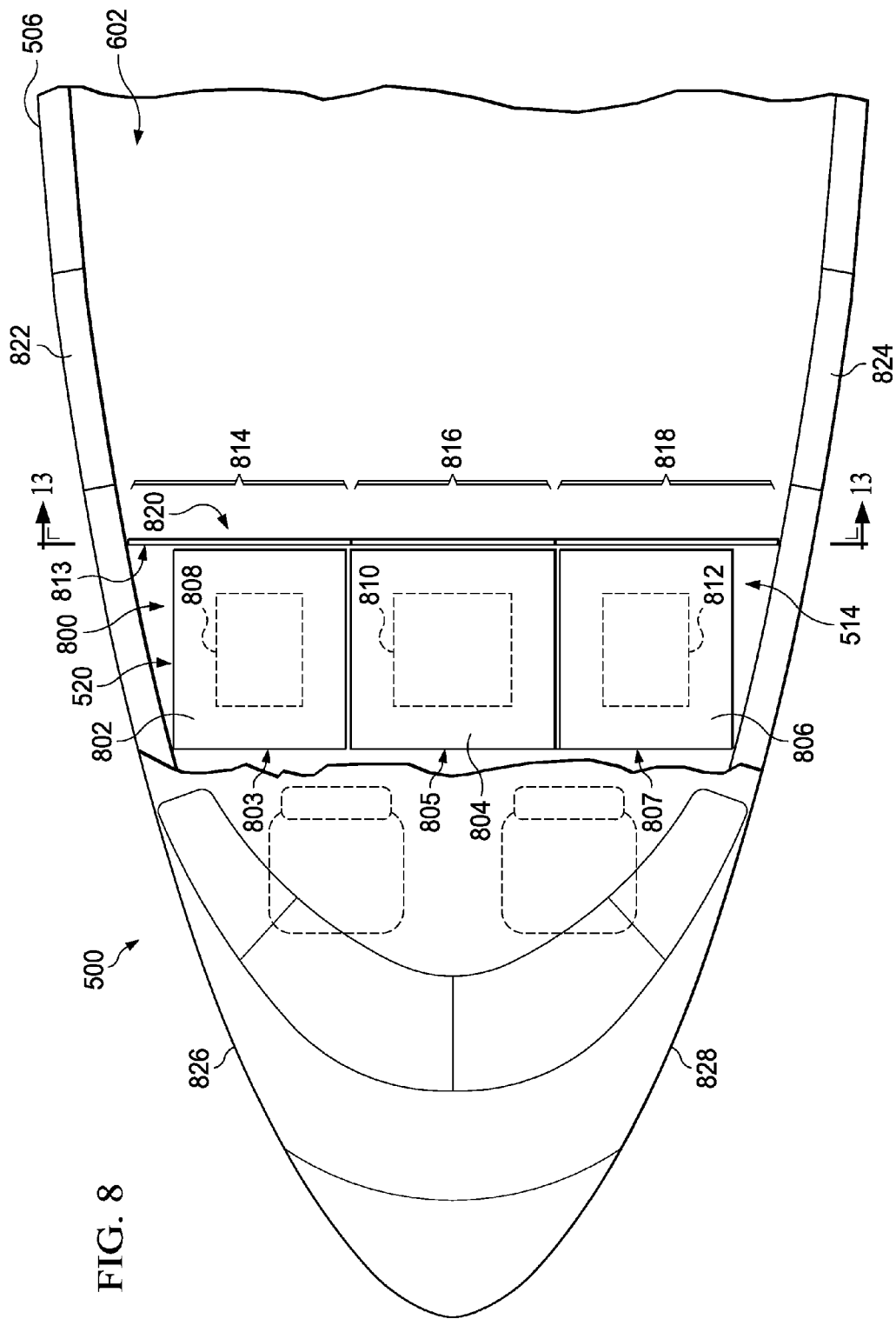
FIG. 8 is an illustration of a portion of an aircraft in a top-exposed view in accordance with an advantageous embodiment.

With reference now to FIG. 8, an illustration of a portion of aircraft 500 from FIG. 5 in a top-exposed view is depicted in accordance with an advantageous embodiment. In this illustrative example, a portion of translating rack system 520 from FIG. 5 is shown in equipment bay 514. In this illustrative example, translating rack system 520 may have rack 800. Rack 800 may be an example of one implementation for rack 701 in FIG. 7. In particular, rack 800 may have configuration 700 in FIG. 7.

As depicted, rack 800 may have movable rack segments 802, 804, and 806. These rack segments may move independently of each other by a translation mechanism, not shown in this example. In this depicted example, movable rack segments 802, 804, and 806 are present in locations 803, 805, and 807, respectively, in equipment bay 514.

As depicted, movable rack segment 802 may be configured to hold equipment 808. Movable rack segment 804 may be configured to hold equipment 810. Movable rack segment 806 may be configured to hold equipment 812. In this illustrative example, equipment 808, equipment 810, and equipment 812 may be electronic and/or electrical equipment for aircraft 500.

Additionally, barrier structure 813 may be associated with rack 800 in this depicted example. Barrier structure 813 may have, for example, without limitation, parts 814, 816, and 818. Part 814 may be associated with movable rack segment 802, part 816 may be associated with movable rack segment 804, and part 818 may be associated with movable rack segment 806. Barrier structure 813 may provide barrier 820 between cargo area 602 and equipment bay 520. In particular, barrier structure 813 may separate equipment 808, equipment 810, and equipment 812 held within rack 800 in equipment bay 514 from cargo area 602.

Further, in this illustrative example, an operator (not shown) may access cargo area 602 through door 822 and door 824. Door 822 may be located along wall 826 of fuselage 506. Door 824 may be located along wall 828 of fuselage 506. In this manner, door 822 and door 824 may provide external access to any cargo (not shown) or other objects (not shown) located in cargo area 602.

Turning now to FIGS. 9-12, illustrations of different types of movements of one or more of movable rack segments 802, 804, and 806 in rack 800 from FIG. 8 are depicted in accordance with an advantageous embodiment.

Figure 9:
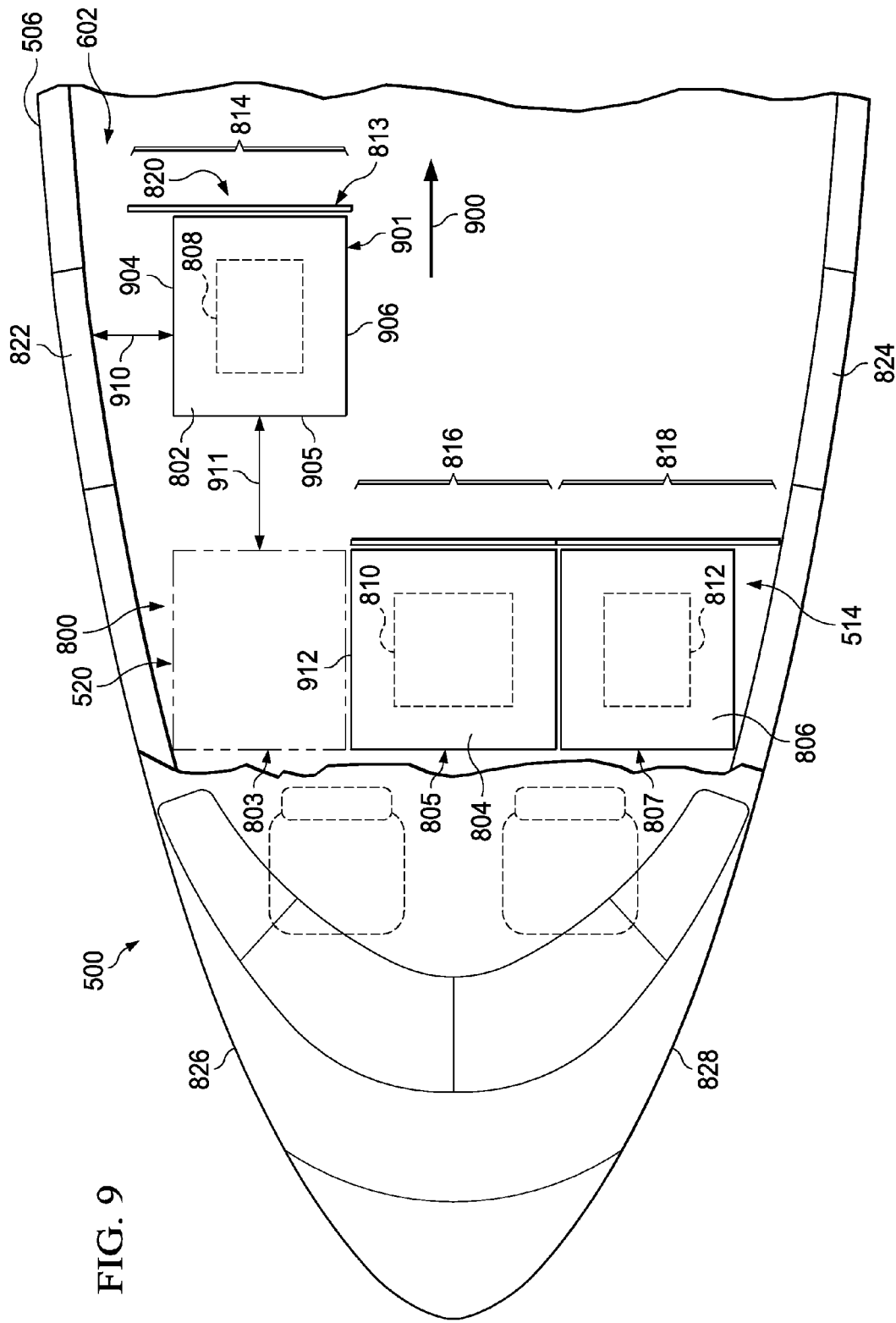
FIG. 9 is an illustration of a different type of movement of a movable rack segment in a rack in accordance with an advantageous embodiment.

In FIG. 9, movable rack segment 802 has been moved from location 803 in equipment bay 514 in the direction of arrow 900 into cargo area 602. In particular, movable rack segment 802 has been moved to location 901 in cargo area 602.

With this movement of movable rack segment 802, access may be provided at side 904 and/or side 906 of movable rack segment 802. Internal access to movable rack segment 802 and/or equipment 808 in movable rack segment 802 may be provided at side 904 and/or side 906 of movable rack segment 802 when movable rack segment 802 is moved into cargo area 602. In this manner, when access is provided at or to at least one side of a particular movable rack segment, access may be provided to the particular movable rack segment and/or the equipment in the particular movable rack segment.

Further, depending on distance 911 between movable rack segment 802 in location 901 and movable rack segment 804, movement of movable rack segment 802 may provide internal access at side 905 of movable rack segment 802 and/or side 912 of movable rack segment 804. For example, when distance 911 provides sufficient clearance for an operator, access at side 905 of movable rack segment 802 and/or side 912 of movable rack segment 804 may be provided.

In this manner, movement of movable rack segment 802 may move movable rack segment 802 from equipment bay 514 into cargo area 602. This movement may provide access to movable rack segment 802, equipment 808 in movable rack segment 802, movable rack segment 804, and/or equipment 810 in movable rack segment 804. With this type of access, additional space and an additional external access hatch may not be needed for equipment bay 514.

For example, without limitation, cargo area 602 may provide space for accessing movable rack segment 802 and/or equipment 808 in movable rack segment 802 when cargo is not present in the portion of cargo area 602 to which movable rack segment 802 is moved. Cargo may not be present in cargo area 602 when, for example, aircraft 500 is on the ground.

In some cases, external access may be provided to movable rack segment 802 through door 822 in cargo area 602. For example, without limitation, external access may be provided, depending on distance 910 between wall 826 of fuselage 506 of aircraft 500 and side 904 of movable rack segment 802. When distance 910 does not provide sufficient clearance for an operator to access movable rack segment 802 and/or equipment 808 in movable rack segment 802 from within cargo area 602, external access may be provided.

For example, without limitation, an operator may use door 822 to access movable rack segment 802 and/or equipment 808 held in movable rack segment 802 when distance 910 does not provide sufficient clearance between wall 826 of fuselage 506 of aircraft 500 and side 904 of movable rack segment 802. In other illustrative examples, external access may be provided through the use of a hatch (not shown), an exterior panel (not shown), or some other suitable type of entrance to cargo area 602.

Figure 10:
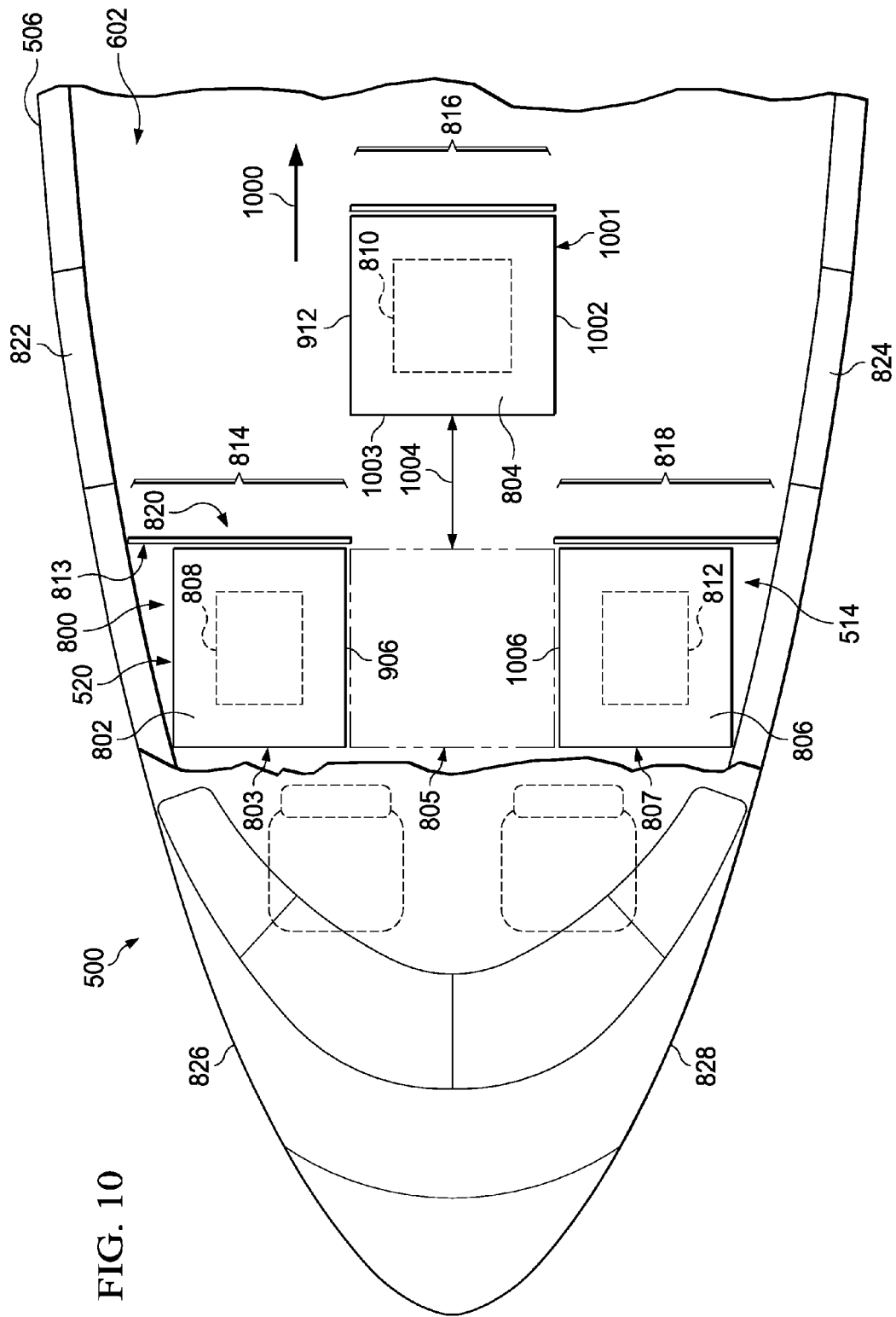
FIG. 10 is an illustration of a different type of movement of a movable rack segment in a rack in accordance with an advantageous embodiment.

Turning now to FIG. 10, movable rack segment 804 has been moved from location 805 in equipment bay 514 in the direction of arrow 1000 into cargo area 602. In particular, movable rack segment 804 may be moved to location 1001 in cargo area 602. Access to movable rack segment 804 and equipment 810 in movable rack segment 804 may be provided from side 912 and/or side 1002 of movable rack segment 804. In these illustrative examples, this access may be internal access to movable rack segment 804.

Further, when distance 1004 provides sufficient clearance for an operator, internal access may be provided to side 1003 of movable rack segment 804, side 906 of movable rack segment 802, and/or side 1006 of movable rack segment 806.

Figure 11:
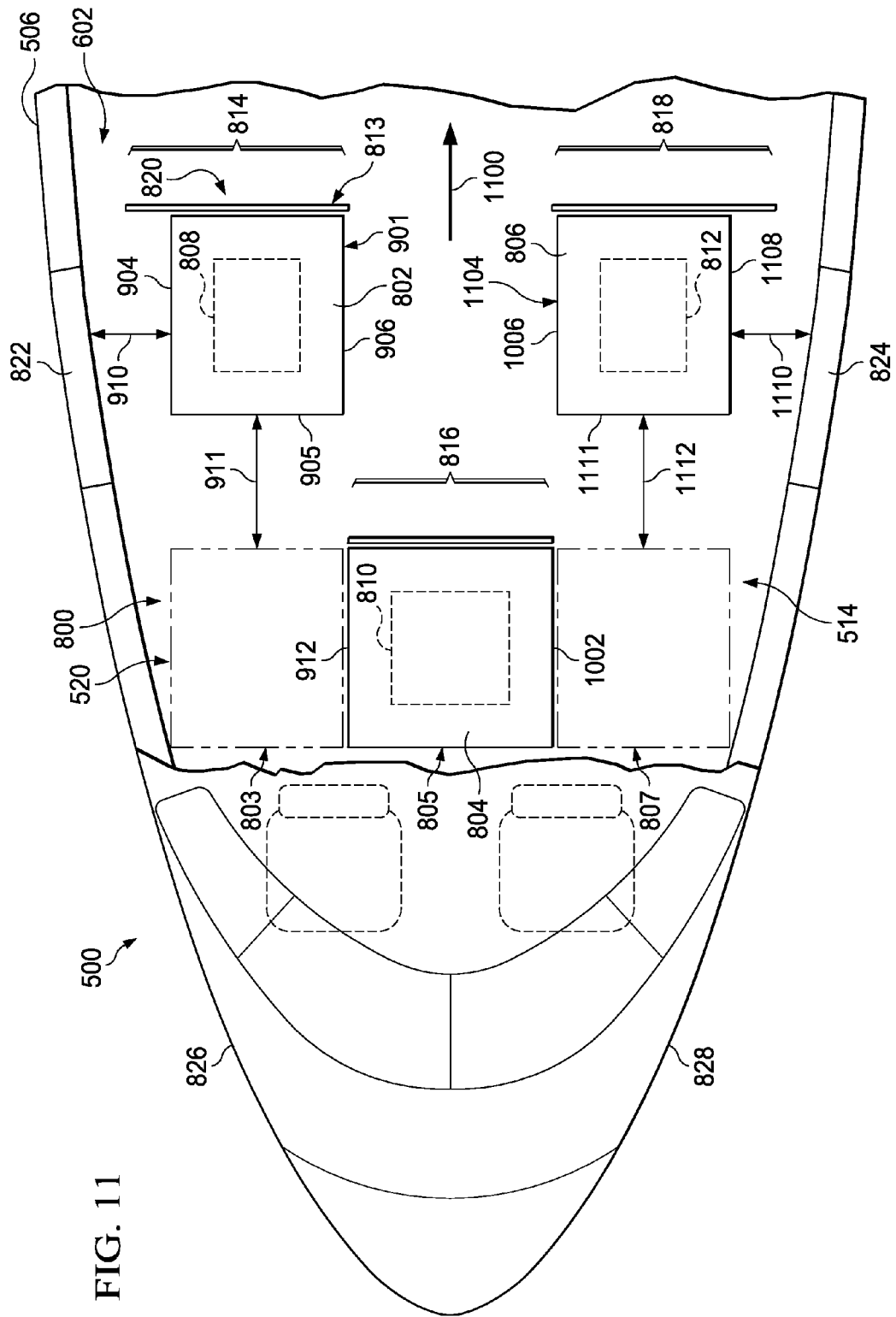
FIG. 11 is an illustration of a different type of movement of a movable rack segment in a rack in accordance with an advantageous embodiment.

In FIG. 11, movable rack segment 802 and movable rack segment 806 may be moved from equipment bay 514 in the direction of arrow 1100 into cargo area 602. As depicted, movable rack segment 802 may be moved from location 803 in equipment bay 514 to location 901 in cargo area 602. Further, movable rack segment 806 may be moved from location 807 in equipment bay 514 to location 1104 in cargo area 602.

The movements of movable rack segment 802 and movable rack segment 806 may provide access to side 904 and side 906 of movable rack segment 802 and to side 1006 and side 1108 of movable rack segment 806.

In this illustrative example, internal access may be provided at side 906 of movable rack segment 802 and side 1006 of movable rack segment 806. Further, depending on distance 911 and/or distance 1112, internal access may also be provided to side 905 of movable rack segment 802, side 1111 of movable rack segment 806, side 912 of movable rack segment 804, and/or side 1002 of movable rack segment 804.

Additionally, external access and/or internal access may be provided at side 904 of movable rack segment 802, depending on distance 910 as discussed before. In a similar fashion, if distance 1110 between wall 828 of fuselage 506 and side 1108 of movable rack segment 806 does not provide sufficient clearance for an operator to access movable rack segment 806 and/or equipment 812 held in movable rack segment 806, external access may be provided through door 824 in these illustrative examples.

Figure 12:
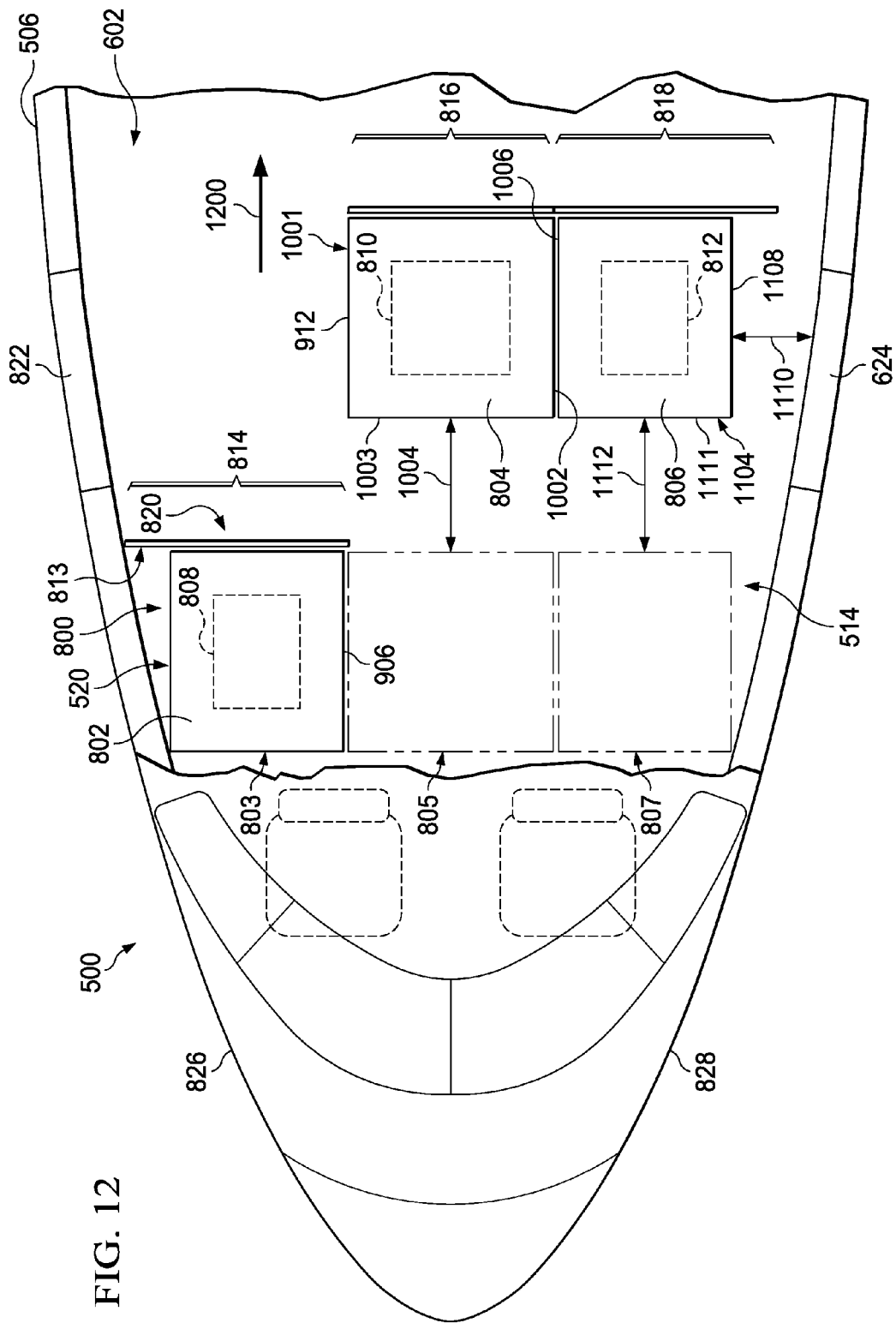
FIG. 12 is an illustration of a different type of movement of a movable rack segment in a rack in accordance with an advantageous embodiment.

In FIG. 12, movable rack segment 804 and movable rack segment 806 may be moved from equipment bay 514 in the direction of arrow 1200 into cargo area 602. In particular, movable rack segment 804 may be moved from location 805 in equipment bay 514 to location 1001 in cargo area 602. Further, movable rack segment 806 may be moved from location 807 in equipment bay 514 to location 1104 in cargo area 602.

As depicted, when both movable rack segment 804 and movable rack segment 806 are moved into cargo area 602, internal access may not be provided at side 1002 of movable rack segment 804 and/or side 1006 of movable rack segment 806. Internal access may be provided at side 912 of movable rack segment 804. Internal access may also be provided to side 1003 of movable rack segment 804, side 1111 of movable rack segment 806, and/or side 906 of movable rack segment 802, depending on distance 1004 and/or distance 1112. Further, internal and/or external access may be provided at side 1108 of movable rack segment 806, depending on distance 1110 as described above.

Figure 13:
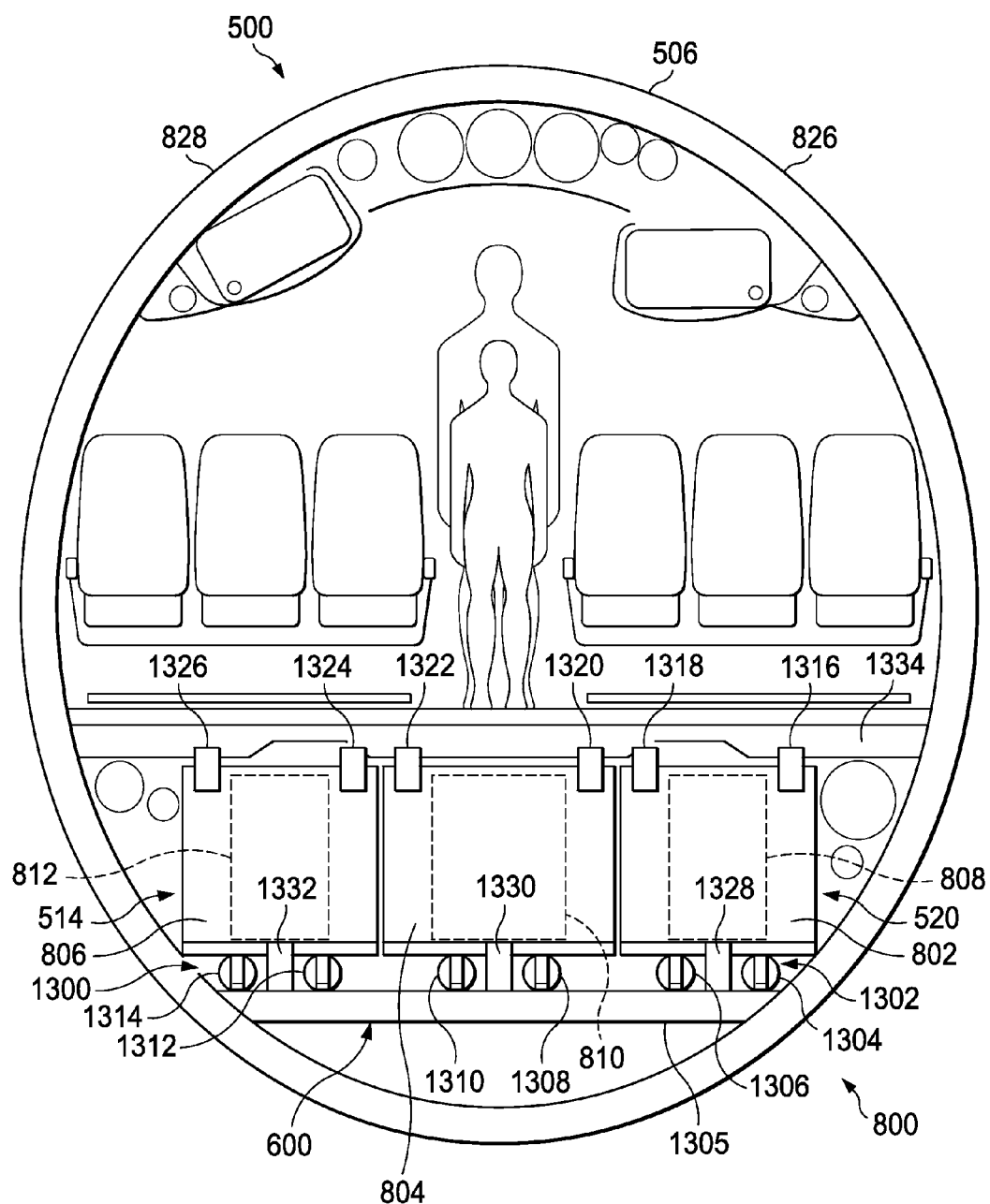
FIG. 13 is an illustration of a cross-sectional view of a translating rack system in an equipment bay in accordance with an advantageous embodiment.

With reference now to FIG. 13, a cross-sectional view of a translating rack system in an equipment bay is depicted in accordance with an advantageous embodiment. In this illustrative example, translating rack system 520 in equipment bay 514 from FIGS. 5-12 is shown in a cross-sectional view taken along lines 13-13 in FIG. 8. In this view, a portion of translating rack system 520 is depicted. In particular, movable rack segments 802, 804, and 806 are illustrated in this view.

As depicted in this example, translating rack system 520 may include translation mechanism 1300. Translation mechanism 1300 may have number of movement devices 1302. Number of movement devices 1302 may comprise wheels 1304, 1306, 1308, 1310, 1312, and 1314. Wheels 1304, 1306, 1308, 1310, 1312, and 1314 may allow movable racks segments 802, 804, and 806 to move on cargo floor 1305.

Wheel 1304 and wheel 1306 may be associated with movable rack segment 802. Wheel 1308 and wheel 1310 may be associated with movable rack segment 804. Wheel 1312 and wheel 1314 may be associated with movable rack segment 806. Wheels 1304, 1306, 1308, 1310, 1312, and 1314 may allow movable rack segments 802, 804, and 806 to move on cargo floor 1305 of cargo deck 600 of aircraft 500.

Additionally, barrier stops 1316, 1318, 1320, 1322, 1324, 1326, 1328, 1330, and 1332 may be present. Barrier stops 1316, 1318, 1320, 1322, 1324, 1326, 1328, 1330, and 1332 may limit movement of movable rack segments 802, 804, and 806 into cargo area 602 in FIG. 8. Further, barrier stops 1316, 1318, 1320, 1322, 1324, 1326, 1328, 1330, and 1332 may prevent cargo (not shown) that may be in cargo area 602 in FIG. 8 from entering equipment bay 514.

As illustrated, barrier stops 1316, 1318, 1320, 1322, 1324, and 1326 may be associated with ceiling 1334 of cargo deck 600. Barrier stops 1328, 1330, and 1332 may be associated with cargo floor 1305 of cargo deck 600.

The illustration of rack 800 in FIGS. 8-13 is an illustrative example of a physical implementation for rack 701 shown in block form in FIG. 7. These illustrations are not meant to imply physical or architecture limitations to the manner in which an advantageous embodiment may be implemented. Other components in addition to and/or in place of the ones illustrated may be used. Some components may be unnecessary in some advantageous embodiments. For example, in some advantageous embodiments, rack 800 may include a fixed rack segment.

Figure 14:
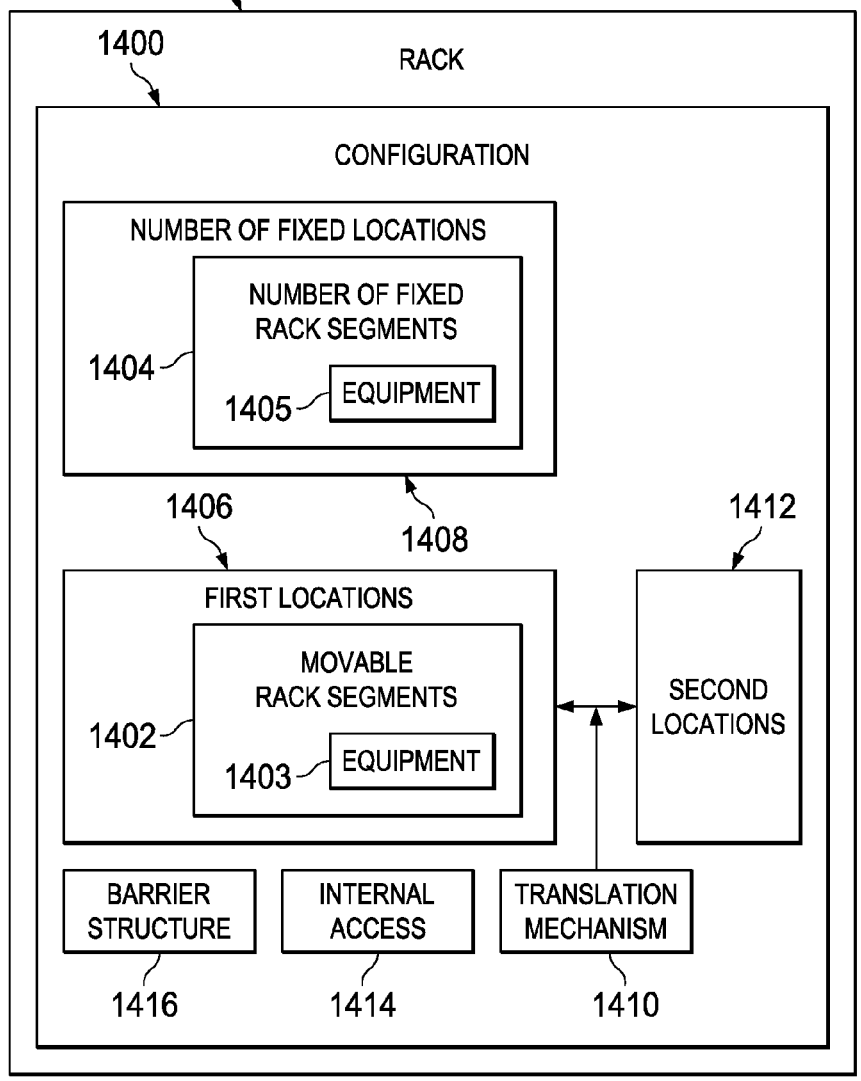
FIG. 14 is an illustration of another configuration for a rack in a translating rack system in accordance with an advantageous embodiment.

With reference now to FIG. 14, an illustration of another configuration for a rack in a translating rack system is depicted in accordance with an advantageous embodiment. In this illustrative example, configuration 1400 for rack 1401 is another example of one implementation for a configuration for a rack for one of number of translating rack systems 422 in FIG. 4. In particular, configuration 1400 for rack 1401 may be an example of one implementation for a configuration for a rack for first translating rack system 424 in equipment bay 426 in FIG. 4.

As depicted, with configuration 1400, rack 1401 may have movable rack segments 1402 and number of fixed rack segments 1404. Movable rack segments 1402 may be configured to hold equipment 1403, while number of fixed rack segments 1404 may be configured to hold equipment 1405. Equipment 1403 and equipment 1405 may be examples of equipment 412 in FIG. 4.

In this illustrative example, movable rack segments 1402 may have a configuration similar to the configuration for movable rack segments 702 in FIG. 7. Further, movable rack segments 1402 may be configured to move independently of each other in a manner similar to the manner in which movable rack segments 702 move in FIG. 7.

In this depicted example, movable rack segments 1402 may be present in first locations 1406 in equipment bay 426 from FIG. 4 and may be movable. Number of fixed rack segments 1404 may not be movable. Number of fixed rack segments 1404 may be present in number of fixed locations 1408. Number of fixed locations 1408 and first locations 1406 may be selected such that sufficient clearance is not provided for an operator (not shown) to access number of fixed rack segments 1404. In other words, the operator (not shown) may be unable to internally access equipment 1405 held by number of fixed rack segments 1404 when movable rack segments 1402 are present in first locations 1406.

Movable rack segments 1402 may move away from first locations 1406 independently of each other by translation mechanism 1410. Translation mechanism 1410 may be implemented using, for example, without limitation, translation mechanism 326 in FIG. 3.

In this illustrative example, without limitation, any of movable rack segments 1402 may be moved from a location in first locations 1406 to a location in second locations 1412 in equipment bay 426 in FIG. 4. Movement of a particular movable rack segment in movable rack segments 1402 may provide internal access 1414 to at least a portion of equipment 1403 held by the particular movable segment and/or various portions of equipment 1403 held by other movable rack segments in movable rack segments 1402.

Further, movement of one or more of movable rack segments 1402 away from first locations 1406 may provide internal access 1414 to at least a portion of equipment 1405 held by number of fixed rack segments 1404 when sufficient clearance is provided between first locations 1406 and number of fixed locations 1408.

In this illustrative example, barrier structure 1416 may be associated with rack 1401. Barrier structure 1416 may be implemented in a manner similar to the manner described for barrier structure 722 in FIG. 7.

Figure 15:
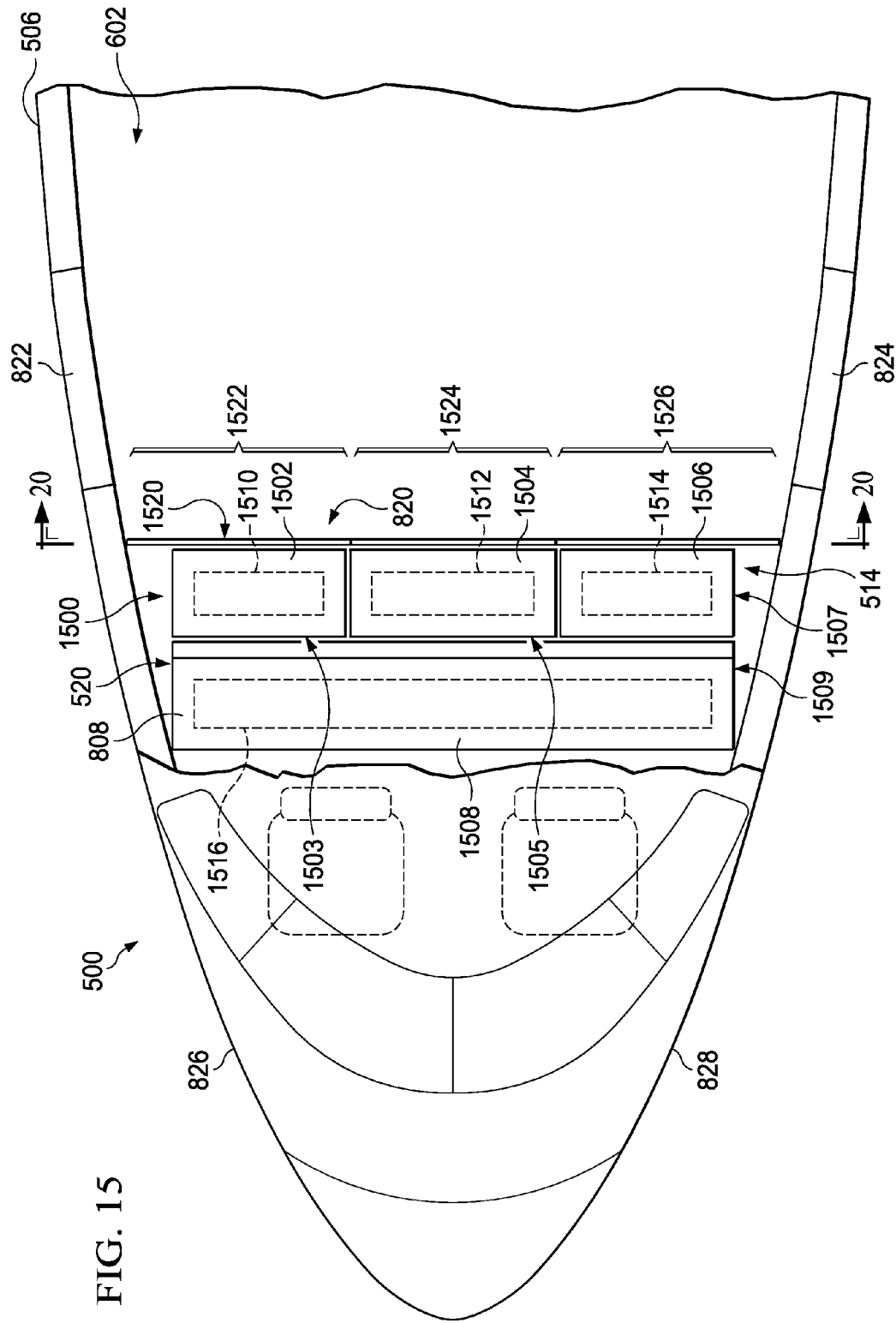
FIG. 15 is an illustration of a translating rack system in an equipment bay in accordance with an advantageous embodiment.

With reference now to FIG. 15, an illustration of a translating rack system in an equipment bay is depicted in accordance with an advantageous embodiment. In this illustrative example, translating rack system 520 from FIGS. 5-13 is depicted as having rack 1500. Rack 1500 may have a different configuration than rack 800 in FIG. 8. In particular, rack 1500 may have configuration 1400 from FIG. 14.

In this illustrative example, rack 1500 may have movable rack segment 1502, movable rack segment 1504, and movable rack segment 1506 located in equipment bay 514. Additionally, rack 1500 also may have fixed rack segment 1508 in equipment bay 514. Movable rack segment 1502 may be in location 1503. Movable rack segment 1504 may be in location 1505. Movable rack segment 1506 may be in location 1507. Fixed rack segment 1508 may be in location 1509. Movable rack segment 1502, movable rack segment 1504, and movable rack segment 1506 may move independently of each other and with respect to fixed rack segment 1508.

Equipment 1510 may be held in movable rack segment 1502, equipment 1512 may be held in movable rack segment 1504, and equipment 1514 may be held in movable rack segment 1506. Further, equipment 1516 may be held in fixed rack segment 1508. In this illustrative example, barrier structure 1520 also may be associated with rack 1500. In particular, barrier structure 1520 may have part 1522, part 1524, and part 1526 associated with movable rack segment 1502, movable rack segment 1504, and movable rack segment 1506, respectively. Barrier structure 1520 may separate equipment bay 514 from cargo area 602 in this illustrative example.

Turning now to FIGS. 16-19, illustrations of different types of movements of one or more of movable rack segments 1502, 1504, and 1506 in rack 1500 from FIG. 15 are depicted in accordance with an advantageous embodiment.

Figure 16:
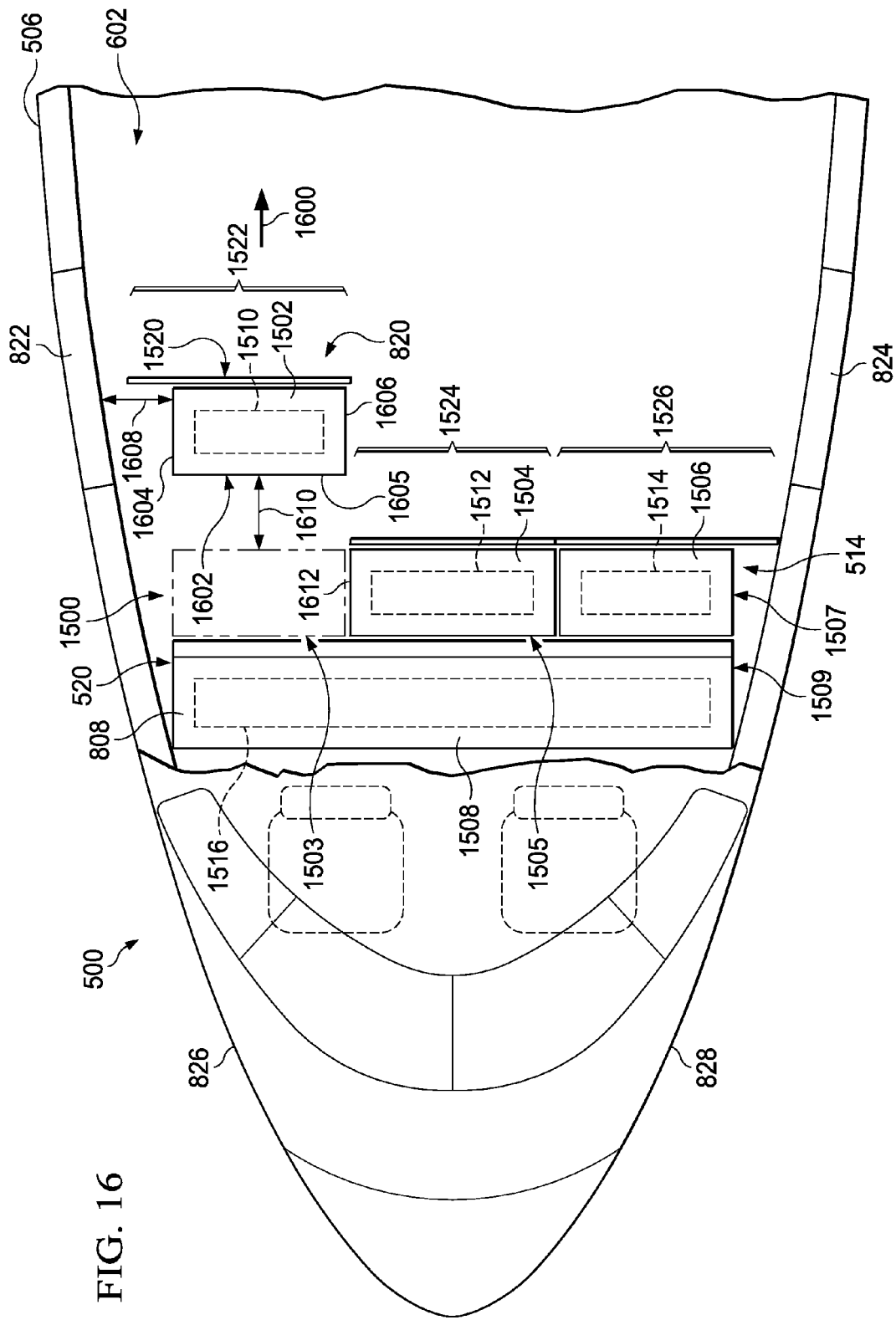
FIG. 16 is an illustration of a different type of movement of a movable rack segment in a rack in accordance with an advantageous embodiment.

In FIG. 16, movable rack segment 1502 has been moved in the direction of arrow 1600. As depicted, movable rack segment 1502 may be moved from location 1503 in equipment bay 514 to location 1602 in cargo area 602. This movement may provide access to movable rack segment 1502 and equipment 1510 in movable rack segment 1502.

In particular, this movement may provide access at side 1604 and/or side 1606 of movable rack segment 1502. Access at side 1606 may be internal access. Access at side 1604 may be internal and/or external access, depending on distance 1608 between wall 826 of fuselage 506 and side 1604 of movable rack segment 1502. Depending on distance 1610, internal access may also be provided to side 1605 of movable rack segment 1502 and/or side 1612 of movable rack segment 1504.

Additionally, internal access also may be provided to a portion of fixed rack segment 1508 and a portion of equipment 1516 in fixed rack segment 1508 when movable rack segment 1502 is moved out of location 1503.

Figure 17:
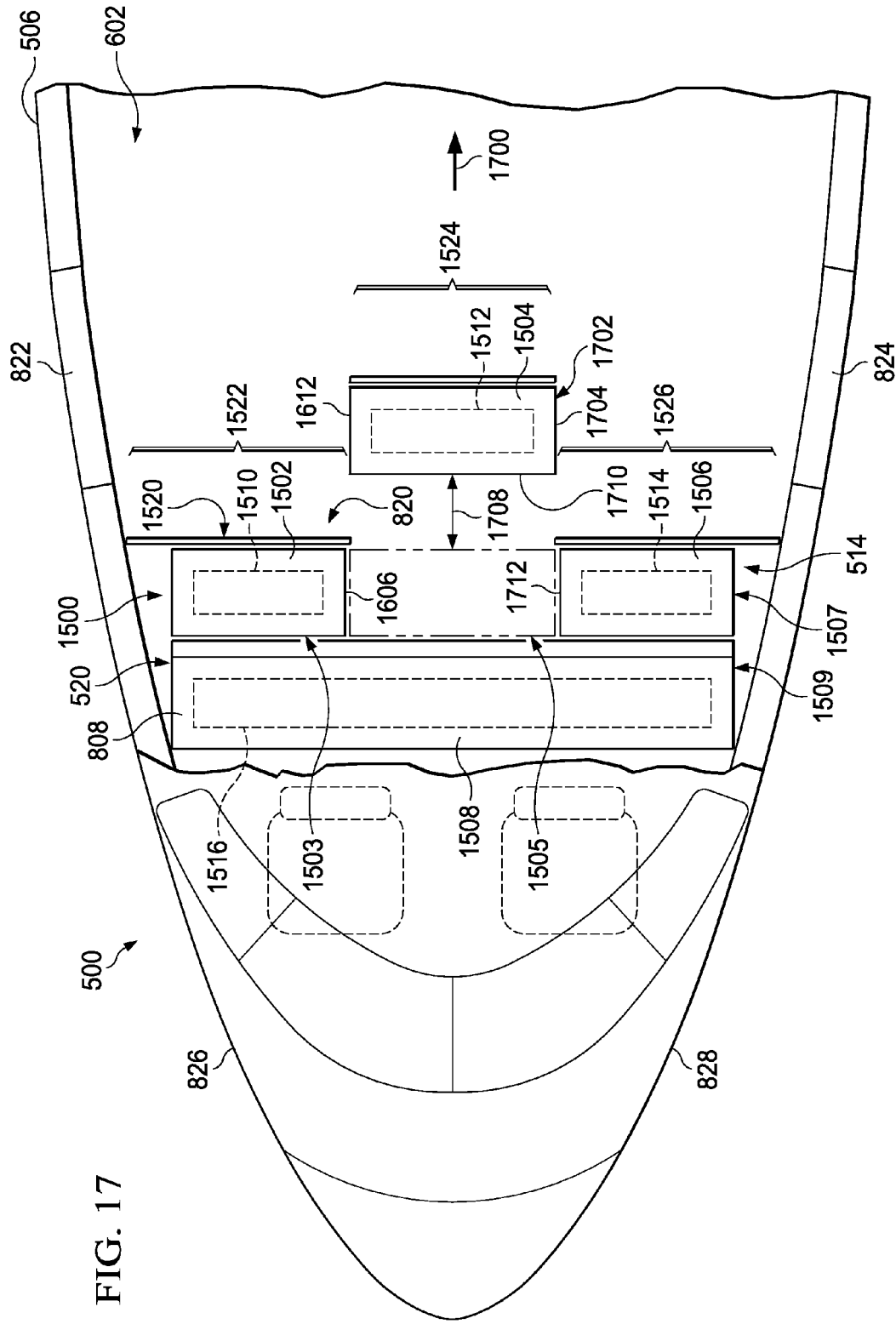
FIG. 17 is an illustration of a different type of movement of a movable rack segment in a rack in accordance with an advantageous embodiment.

Turning now to FIG. 17, movable rack segment 1504 has been moved in the direction of arrow 1700. Movable rack segment 1504 may be moved from location 1505 in equipment bay 514 to location 1702 in cargo area 602. Movement of movable rack segment 1504 to location 1702 may provide internal access to movable rack segment 1504 and equipment 1512 in movable rack segment 1504 at side 1612 and/or side 1704 of movable rack segment 1504. Further, depending on distance 1708, internal access may also be provided to side 1710 of movable rack segment 1504, side 1606 of movable rack segment 1502, and/or side 1712 of movable rack segment 1506.

Additionally, internal access may be provided to a portion of equipment 1516 in fixed rack segment 1508 when movable rack segment 1504 is moved away from location 1505.

Figure 18:
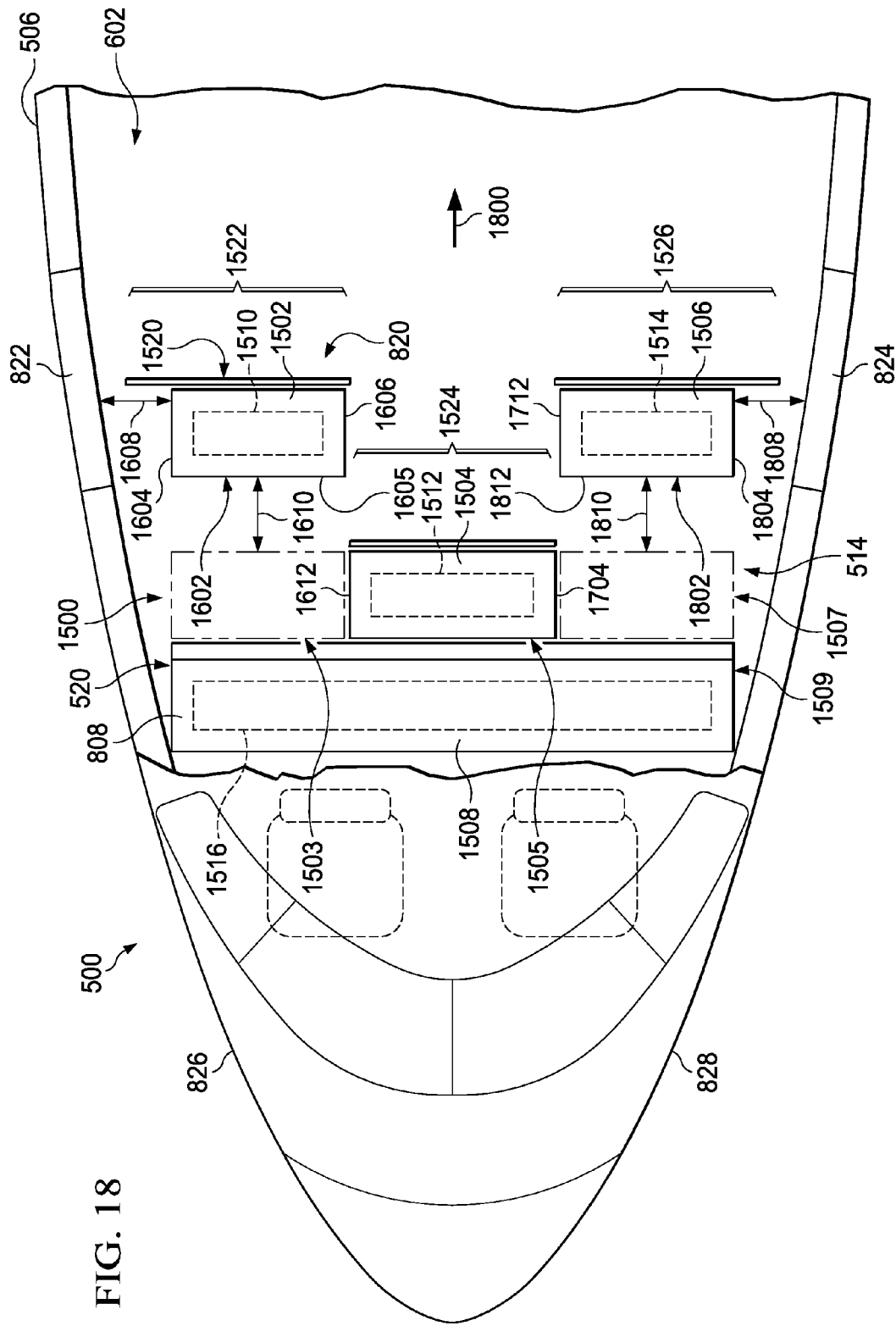
FIG. 18 is an illustration of a different type of movement of a movable rack segment in a rack in accordance with an advantageous embodiment.

In FIG. 18, movable rack segment 1502 and movable rack segment 1506 have been moved in the direction of arrow 1800. Movable rack segment 1502 may be moved from location 1503 in equipment bay 514 to location 1602 in cargo area 602. Further, movable rack segment 1506 may be moved from location 1507 in equipment bay 514 to location 1802 in cargo area 602.

Access to movable rack segment 1502 and/or equipment 1510 in movable rack segment 1502 may be provided at side 1604 and/or at side 1606 as discussed before. Further, access may be provided to movable rack segment 1506 at side 1804 and/or at side 1712 of movable rack segment 1506. The access at side 1804 may be internal and/or external access, depending on distance 1808 between wall 828 of fuselage 506 and side 1804 of movable rack segment 1506. The access at side 1802 may be internal access.

Further, depending on distance 1610 and/or distance 1810, internal access may also be provided to side 1605 of movable rack segment 1502, side 1812 of movable rack segment 1506, side 1704 of movable rack segment 1504, and/or side 1612 of movable rack segment 1504.

Additionally, internal access may be provided to different portions of equipment 1516 in fixed rack segment 1508 when movable rack segment 1502 is moved away from location 1503 and movable rack segment 1506 is moved away from location 1507.

Figure 19:
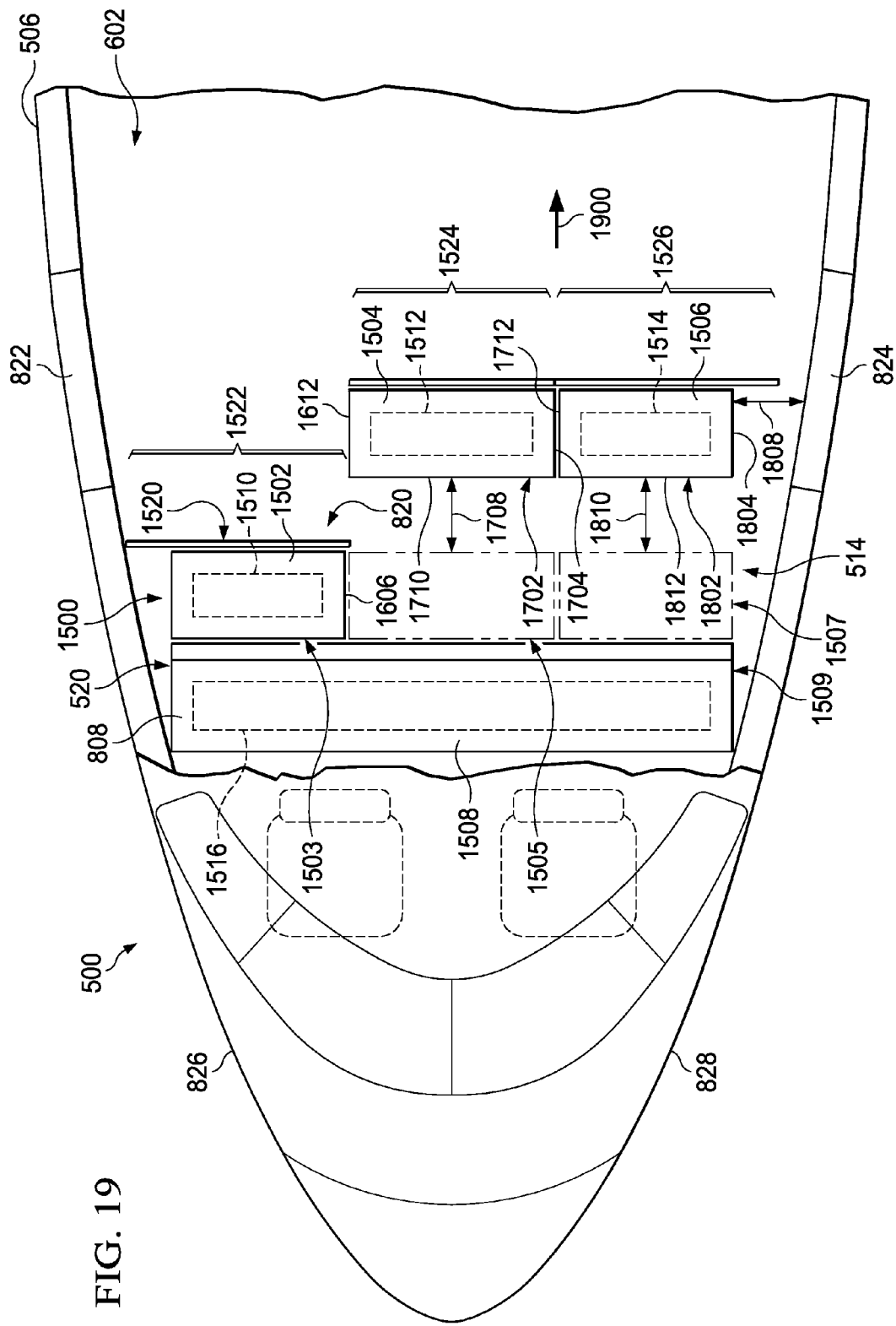
FIG. 19 is an illustration of a different type of movement of a movable rack segment in a rack in accordance with an advantageous embodiment.

Referring now to FIG. 19, movable rack segment 1504 and movable rack segment 1506 have been moved in the direction of arrow 1900. In particular, movable rack segment 1504 may be moved from location 1505 in equipment bay 514 to location 1702 in cargo area 602. Movable rack segment 1506 may be moved from location 1507 in equipment bay 514 to location 1802 in cargo area 602.

Movement of movable rack segment 1504 may provide internal access at side 1612 of movable rack segment 1504. Further, internal and/or external access may be provided at side 1804 of movable rack segment 1506 when movable rack segment 1506 is moved into location 1802, depending on distance 1808. However, in this illustrative example, movement of movable rack segment 1504 and/or movable rack segment 1506 may not provide internal access at side 1712 of movable rack segment 1506 and/or at side 1704 of movable rack segment 1504.

Depending on distance 1708 and/or distance 1810, internal access may be provided to side 1710 of movable rack segment 1504, side 1606 of movable rack segment 1502, and/or side 1812 of movable rack segment 1506. Additionally, internal access may be provided to a portion of equipment 1516 in fixed rack segment 1508 when movable rack segment 1504 and/or movable rack segment 1506 are moved.

Figure 20:
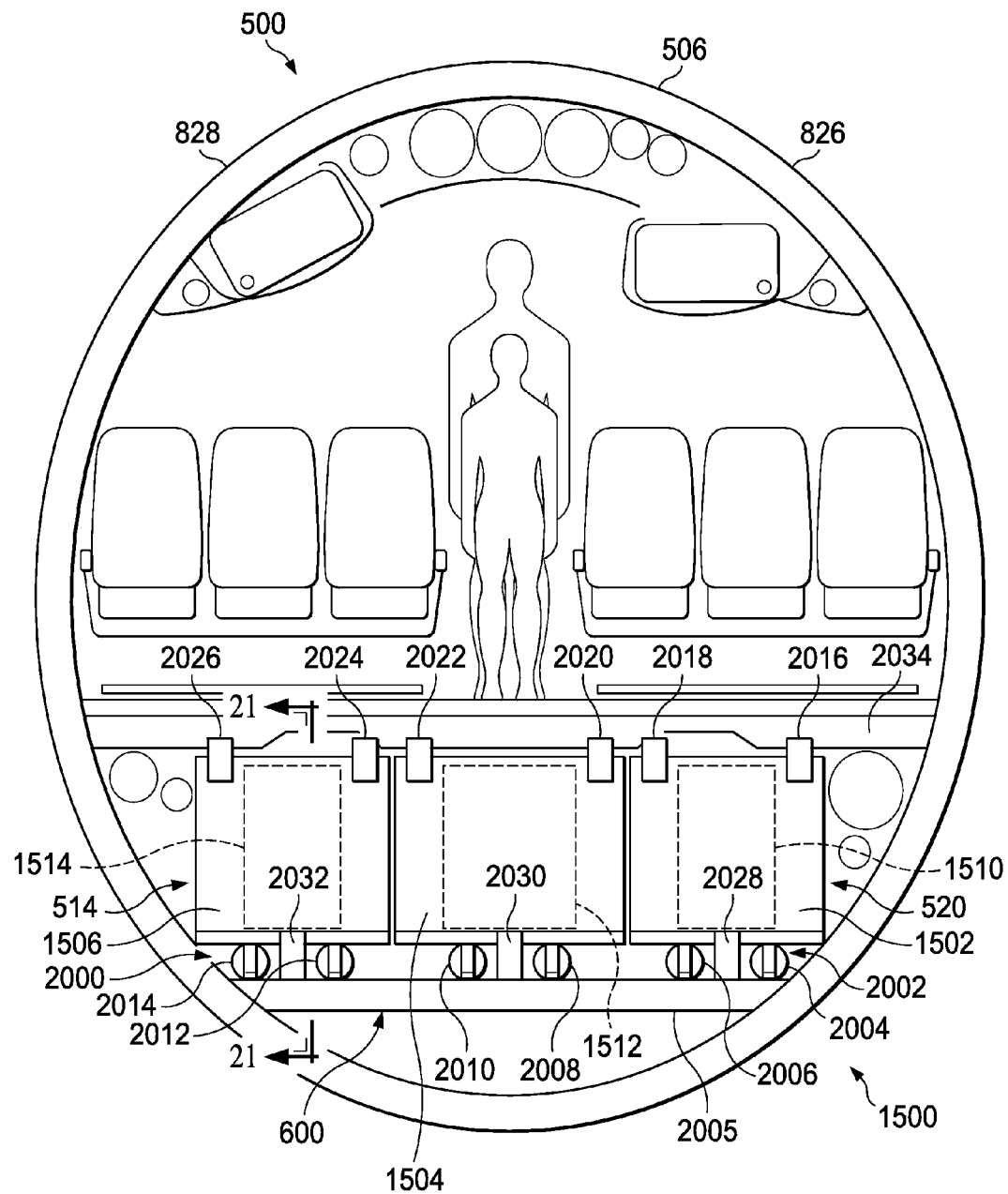
FIG. 20 is an illustration of a cross-sectional view of a translating rack system in an equipment bay in accordance with an advantageous embodiment.

With reference now to FIG. 20, a cross-sectional view of a translating rack system in an equipment bay is depicted in accordance with an advantageous embodiment. In this illustrative example, translating rack system 520 in equipment bay 514 is shown in a cross-sectional view taken along lines 20-20 in FIG. 15. This may be a cross-sectional view looking towards equipment bay 514 in this example.

Further, in this view, movable rack segments 1502, 1504, and 1506 for translating rack system 520 are illustrated without barrier structure 1520 in FIG. 15 associated with movable rack segments 1502, 1504, and 1506. In other words, parts 1522, 1524, and 1526 are not depicted as being associated with movable rack segments 1502, 1504, and 1506 in this view.

As depicted in this example, translating rack system 520 may include translation mechanism 2000. Translation mechanism 2000 may have number of movement devices 2002. Number of movement devices 2002 may comprise wheels 2004, 2006, 2008, 2010, 2012, and 2014.

Wheel 2004 and wheel 2006 may be associated with movable rack segment 1502. Wheel 2008 and wheel 2010 may be associated with movable rack segment 1504. Wheel 2012 and wheel 2014 may be associated with movable rack segment 1506. Wheels 2004, 2006, 2008, 2010, 2012, and 2014 may allow movable rack segments 1502, 1504, and 1506 to move on cargo floor 1305 of cargo deck 600 of aircraft 500.

Additionally, barrier stops 2016, 2018, 2020, 2022, 2024, 2026, 2028, 2030, and 2032 may be present. Barrier stops 2016, 2018, 2020, 2022, 2024, 2026, 2028, 2030, and 2032 may limit movement of movable rack segments 1502, 1504, and 1506 into cargo area 602 in FIG. 15. Further, barrier stops 2016, 2018, 2020, 2022, 2024, 2026, 2028, 2030, and 2032 may prevent cargo (not shown) that may be in cargo bay 602 in FIG. 15 from entering equipment bay 514.

As illustrated, barrier stops 2016, 2018, 2020, 2022, 2024, and 2026 may be associated with ceiling 2034 of cargo deck 600. Barrier stops 2028, 2030, and 2032 may be associated with cargo floor 1305 of cargo deck 600.

Figure 21:
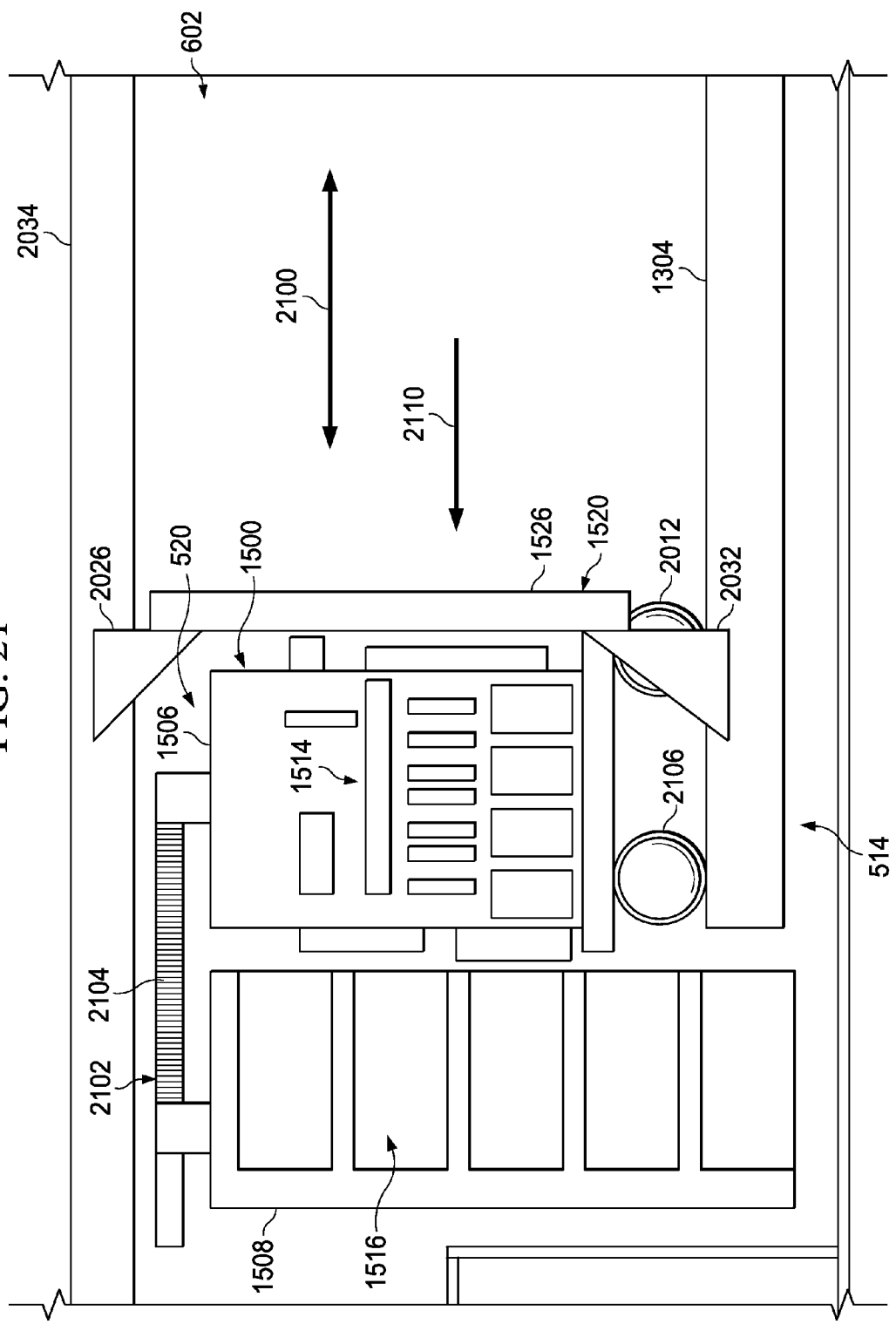
FIG. 21 is an illustration of a cross-sectional side view of a translating rack system in an equipment bay of an aircraft in accordance with an advantageous embodiment.

With reference now to FIG. 21, an illustration of a cross-sectional side view of a translating rack system in an equipment bay of an aircraft is depicted in accordance with an advantageous embodiment. In this illustrative example, translating rack system 520 having rack 1500 from FIG. 15 may be depicted taken along lines 21-21 in FIG. 20. In this illustrative example, barrier structure 1520 may be illustrated associated with rack 1500. In particular, part 1526 of barrier structure 1520 may be seen attached to movable rack segment 1506 in this illustrative example. Further, wheel 2012 for translation mechanism 2000 in FIG. 20 may be seen along with wheel 2106.

As depicted, movable rack segment 1506 may be configured to move within equipment bay 514 relative to fixed rack segment 1508 in a direction along axis 2100. Movable rack segment 1506 and fixed rack segment 1508 may be connected to connector system 2102 comprising rack attachment cable 2104. Rack attachment cable 2104 may be configured to provide power, data, communications, and/or cooling to rack 1500, equipment 1516, and/or equipment 1514.

As depicted, movement of movable rack segment 1506 in the direction of arrow 2110 may cause part 1526 to contact barrier stop 2026 and barrier stop 2032. Barrier stop 2026 and barrier stop 2032 may prevent part 1526 associated with movable rack segment 1506 from moving past barrier stop 2026 and barrier stop 2032. In this manner, movable rack segment 1506 may not be allowed to come into direct contact with fixed rack segment 1508.

The illustration of rack 1500 in FIGS. 15-22 is an illustrative example of a physical implementation for rack 1401 shown in block form in FIG. 14. These illustrations are not meant to imply physical or architecture limitations to the manner in which an advantageous embodiment may be implemented. Other components in addition to and/or in place of the ones illustrated may be used. Some components may be unnecessary in some advantageous embodiments.

For example, in some advantageous embodiments, rack 1500 may not have fixed rack segment 1508. In still other advantageous embodiments, additional movement devices may be present in translation mechanism 2000 in addition to wheels 2004, 2006, 2008, 2010, 2012, and 2014.

Figure 22:
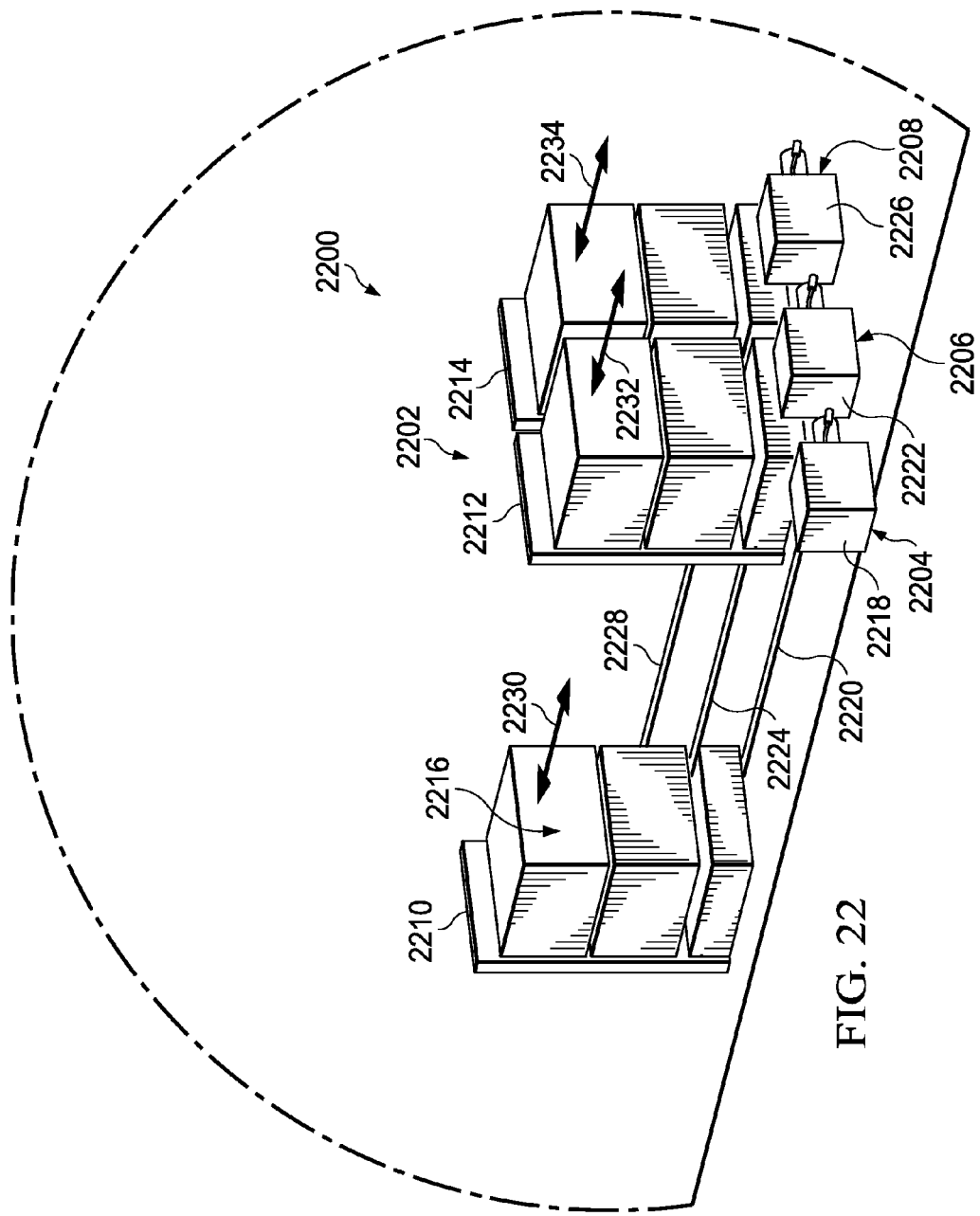
FIG. 22 is an illustration of a cross-sectional view of a translating rack system in an equipment bay in accordance with an advantageous embodiment.

With reference now to FIG. 22, an illustration of a cross-sectional view of a translating rack system is depicted in accordance with an advantageous embodiment. In this illustrative example, translating rack system 2200 is an example of one implementation for translating rack system 314 in FIG. 3.

As depicted, translating rack system 2200 may comprise rack 2202 and translation mechanisms 2204, 2206, and 2208. Rack 2202 may comprise movable rack segments 2210, 2212, and 2214, which are configured to hold components 2216.

Translation mechanism 2204 comprises motor 2218 and track system 2220. Translation mechanism 2206 comprises motor 2222 and track system 2224. Translation mechanism 2208 comprises motor 2226 and track system 2228.

Motor 2218 may be configured to turn a number of gears (not shown) such that movable rack segment 2210 may be moved along track system 2220 along axis 2230. Further, motor 2222 may be configured to turn a number of gears (not shown) such that movable rack segment 2212 may be moved along track system 2224 along axis 2232. Motor 2226 may be configured to turn a number of gears (not shown) such that movable rack segment 2214 may be moved along track system 2228 along axis 2234.

Figure 23:
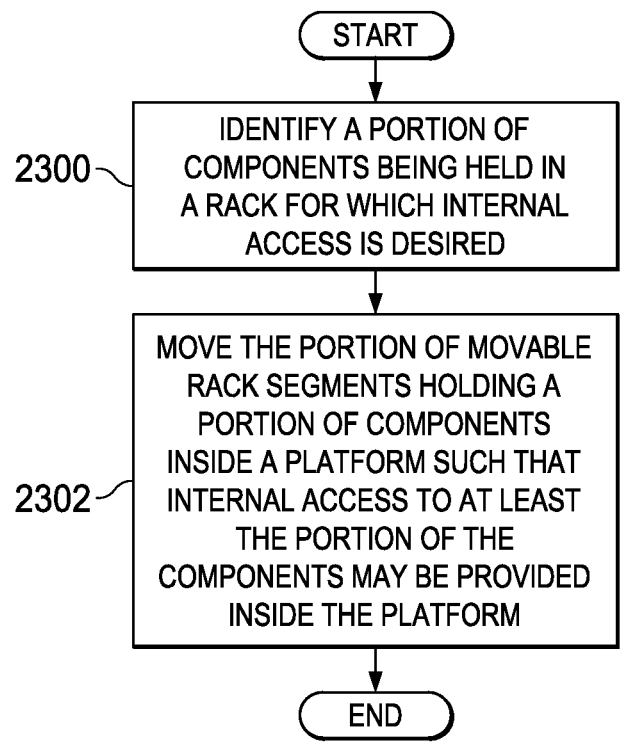
FIG. 23 is an illustration of a flowchart of a process for accessing components in accordance with an advantageous embodiment.

With reference now to FIG. 23, an illustration of a flowchart of a process for accessing components is depicted in accordance with an advantageous embodiment. The process illustrated in FIG. 23 may be implemented using translating rack system 314 in equipment access environment 300 in FIG. 3.

The process may begin by identifying portion 332 of components 322 being held in rack 320 for which internal access 330 is desired (operation 2300). Rack 320 may be configured to hold components 322 and may comprise movable rack segments 324 that may be movable independently of each other in rack 320. Rack 320 may be a compartment in compartments 306 in platform 302 in equipment access environment 300.

The process may then move portion 328 of movable rack segments 324 holding portion 332 of components 322 inside platform 302 such that internal access 330 to at least portion 332 of components 322 may be provided inside platform 302 (operation 2302), with the process terminating thereafter. In operation 2302, movable rack segments 324 may be moved using translation mechanism 326.

The flowchart and block diagrams in the different depicted embodiments illustrate the architecture, functionality, and operation of some possible implementations of apparatus and methods in different advantageous embodiments. In this regard, each block in the flowchart or block diagrams may represent a module, a segment, a function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowchart or block diagrams.

In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved. Also, other blocks may be added in addition to the illustrated blocks in a flowchart or block diagram.

Thus, the different advantageous embodiments provide an apparatus and method for providing internal access to components inside a platform. In one advantageous embodiment, an apparatus may comprise a rack and a translation mechanism. The rack may be configured to hold components. The rack may comprise movable rack segments that are movable independently of each other in the rack. The translation mechanism may be configured to move a portion of the movable rack segments inside a platform such that internal access to at least a portion of the components is provided inside the platform.

In this manner, the different advantageous embodiments may provide a system for providing internal access to components located in an equipment bay (e.g., electrical equipment) in an aircraft without requiring additional space in the equipment bay for this access. Furthermore, movement of movable rack segments holding the components from the equipment bay into a cargo area may allow an operator to access the components from inside the aircraft as compared to outside the aircraft. As a result, advantageously, a volume of space required for operation of an aircraft (e.g., typical electrical equipment) is reduced (more compact packing density) to allow for addition cargo volume.

Furthermore, the advantageous embodiments provide for dual-use of main deck, cargo back area, and surrounding areas since the area for access and to work on can be a dual usage area surrounded by test equipment. In one example, test equipment (electrical equipment) may be individually pulled into the cargo area or the main deck to gain access to the test equipment. Furthermore, the movable rack segments provide individuals or mechanics the ability to remove and/or install equipment with minimal coordination or extra personnel (e.g., elimination of the requirement of three or four persons to remove a 115 lb. box or a crane hook, for instance, running on a dedicated track to complete the removal process).

As such, principles of these advantageous embodiments reduce the number of personnel (e.g., engineers) needed on board to maintain electrical equipment. As a consequence, time for trouble shooting of electrical equipment is reduced when involving equipment removal. Furthermore, the movable rack segments provide for movement of boxes, components, or racks with minimal damage during a maintenance or trouble shooting process.

The description of the different advantageous embodiments has been presented for purposes of illustration and description and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
a rack configured to hold components in which the rack comprises movable rack segments that are movable independently of each other; and
a translation mechanism configured to move a portion of the movable rack segments relative to another portion of the movable rack segments inside a compartment of an aircraft such that internal access to at least a portion of the components is provided inside the compartment;
wherein the rack and the translation mechanism are located inside an equipment bay in the compartment; and
wherein movement of the portion of the movable rack segments relative to the another portion of the movable rack segments inside the compartment moves the portion of the movable rack segments into another area inside the compartment other than the equipment bay.

2. The apparatus of claim 1, wherein the translation mechanism comprises at least one of wheels, rollers, sliders, tracks, arms, rails, hinges, pivot points, and joints associated with the rack.

3. The apparatus of claim 1, wherein the translation mechanism comprises:
a number of movement devices connected to the movable rack segments; and
a motor system configured to move the number of movement devices connected to the movable rack segments such that the movable rack segments move independently of each other.

4. The apparatus of claim 1, wherein movement of the portion of the movable rack segments is such that external access to the at least the portion of the components is provided outside of the compartment.

5. The apparatus of claim 1 further comprising:
a connector system attached to the movable rack segments, wherein the connector system is configured to remain connected to the movable rack segments when the portion of the movable rack segments inside the compartment is moved such that the internal access to the at least the portion of the components is provided inside the compartment.

6. The apparatus of claim 1 further comprising:
a structure associated with the rack, wherein the structure is configured to separate an equipment bay in which the rack is located from another area in the compartment.

7. The apparatus of claim 6, wherein the structure comprises a barrier configured to prevent cargo in the another area from moving into the equipment bay.

8. The apparatus of claim 6, wherein the structure comprises parts in which each part is associated with a movable rack segment in the movable rack segments.

9. The apparatus of claim 1, wherein the rack further comprises:
a fixed rack segment configured to hold some of the components, wherein the fixed rack segment does not move and the movable rack segments are configured to move relative to the fixed rack segment in which movement of the portion of the movable rack segments inside the compartment is such that the internal access to the at least the portion of the components held by at least one of the fixed rack segment and the movable rack segments is provided inside the compartment.

10. The apparatus of claim 1, further comprising:
a part of a barrier structure inside the compartment that is attached to a movable rack segment;
a barrier stop configured to prevent the part from moving past the barrier stop and to not allow the movable rack segment from coming into direct contact with a fixed rack segment of the rack; and
a rack attachment cable configured to provide one or more of power, data, communications, and cooling to equipment of the movable rack segment and equipment of the fixed rack segment.

11. An equipment access system for an aircraft comprising:
a rack located in an equipment bay inside the aircraft and configured to hold components in which the rack comprises movable rack segments that are movable independently of each other in the rack;
a translation mechanism located in the equipment bay inside the aircraft in which the translation mechanism is configured to move a portion of the movable rack segments relative to another portion of the movable rack segments in which the portion of the movable rack segments is moved into another area inside the aircraft other than the equipment bay such that internal access to at least a portion of the components is provided inside the aircraft and external access to the at least the portion of the components is provided outside of the aircraft and in which the translation mechanism comprises at least one of wheels, tracks, rollers, sliders, arms, rails, hinges, pivot points, and joints associated with the rack and a number of actuators connected to the movable rack segments and configured to move the movable rack segments;
a connector system attached to the movable rack segments in which the connector system is configured to remain connected to the movable rack segments when the portion of the movable rack segments is moved into the another area inside the aircraft other than the equipment bay; and
a structure associated with the rack in which the structure is configured to separate the equipment bay in which the rack is located from the another area in the aircraft such that the structure provides a barrier configured to prevent cargo in the another area from moving into the equipment bay and in which the structure comprises parts in which each part is associated with a movable rack segment in the movable rack segments.

12. The equipment access system of claim 11, wherein the rack further comprises:
a fixed rack segment configured to hold some of the components, wherein the fixed rack segment does not move and the movable rack segments are configured to move relative to the fixed rack segment in which movement of the portion of the movable rack segments inside the aircraft is such that the internal access to the at least the portion of the components held by at least one of the fixed rack segment and the movable rack segments is provided inside the aircraft.

* * * * *